United States Patent
Turner et al.

(10) Patent No.: US 8,494,037 B2
(45) Date of Patent: Jul. 23, 2013

(54) COMPLEX ADAPTIVE PHASE DISCRIMINATOR

(75) Inventors: Larry A. Turner, Chapel Hill, NC (US); Zhi Gao, Wake Forest, NC (US)

(73) Assignee: Schneider Electric USA, Inc., Palatine, IL (US)

( * ) Notice: Subject to any disclaimer, the term of this patent is extended or adjusted under 35 U.S.C. 154(b) by 166 days.

(21) Appl. No.: 12/961,061

(22) Filed: Dec. 6, 2010

(65) Prior Publication Data
US 2012/0140806 A1 Jun. 7, 2012

(51) Int. Cl.
H04B 3/46 (2006.01)
H04B 17/00 (2006.01)
H04Q 1/20 (2006.01)

(52) U.S. Cl.
USPC ........... 375/224; 370/241; 370/242; 370/246; 370/250; 370/252; 379/90.01; 379/91.01; 379/92.01; 379/93.01; 455/67.11; 455/67.12; 455/67.13; 455/67.14; 702/79

(58) Field of Classification Search
None
See application file for complete search history.

(56) References Cited

U.S. PATENT DOCUMENTS

| | | |
|---|---|---|
| 4,455,522 A | 6/1984 | Lipo |
| 5,477,162 A | 12/1995 | Heikkila |
| 5,661,386 A | 8/1997 | Kueck et al. |
| 5,689,169 A | 11/1997 | Kerkman et al. |
| 5,832,413 A * | 11/1998 | Benco et al. ............ 702/77 |
| 5,861,728 A | 1/1999 | Tazawa et al. |
| 5,965,995 A | 10/1999 | Seibel et al. |
| 6,452,360 B1 | 9/2002 | Colby |
| 6,456,950 B1 * | 9/2002 | El-Ghoroury et al. .......... 702/75 |
| 6,636,012 B2 | 10/2003 | Royak et al. |
| 6,774,664 B2 | 8/2004 | Godbersen |
| 6,862,538 B2 | 3/2005 | El-Ibiary |
| 7,135,830 B2 | 11/2006 | El-Ibiary |
| 7,184,902 B2 | 2/2007 | El-Ibiary |
| 7,289,893 B2 * | 10/2007 | Gouriet et al. ................. 701/37 |
| 7,397,212 B2 | 7/2008 | Turner |
| 7,570,074 B2 | 8/2009 | Gao et al. |

(Continued)

OTHER PUBLICATIONS

Akagi et al.; "Instantaneous Reactive Power Compensators Comprising Switching Devices Without Energy Storage Components"; *IEEE Transaction on Industry Applications*; vol. 1A-20, No. 3, pp. 625-630, May/Jun. 1984.

(Continued)

*Primary Examiner* — Shuwang Liu
*Assistant Examiner* — Gina McKie
(74) *Attorney, Agent, or Firm* — Nixon Peabody LLP

(57) ABSTRACT

A Complex Adaptive Phase Discriminator (PD), as presented in some concepts of the present disclosure, is an adaptive filter that accurately estimates the instantaneous frequency of a dynamic complex signal. The PD can demonstrate accurate instantaneous frequency estimation and rapid convergence in dynamic complex signal environments, even when the frequency of its input may change rapidly. A direct PD architecture can estimate the instantaneous frequency of a complex primary signal, iteratively adapting a phase of a complex exponential by minimizing the mean squared error of a complex error signal. Instantaneous frequency can be directly estimated from the phase of the complex exponential. In contrast, an indirect PD architecture can estimate the instantaneous frequency of a complex primary signal, iteratively adapting a complex coefficient by minimizing the mean squared error of a complex error signal. Instantaneous frequency can be indirectly estimated by extracting the phase of the complex coefficient.

20 Claims, 6 Drawing Sheets

U.S. PATENT DOCUMENTS

| | | | |
|---|---|---|---|
| 2003/0062870 A1* | 4/2003 | Royak et al. | 318/727 |
| 2006/0082077 A1* | 4/2006 | Gouriet et al. | 280/5.5 |
| 2006/0097688 A1* | 5/2006 | Patel et al. | 318/778 |
| 2009/0284204 A1 | 11/2009 | Colby et al. | |
| 2009/0284211 A1 | 11/2009 | Gao et al. | |
| 2009/0284212 A1 | 11/2009 | Turner et al. | |
| 2009/0287437 A1 | 11/2009 | Turner | |
| 2009/0287463 A1 | 11/2009 | Turner et al. | |

OTHER PUBLICATIONS

Boashash; "Estimating and Interpreting the Instantaneous Frequency of a Signal—Part 1: Fundamentals"; *Proceedings of the IEEE*; vol. 80, No. 4, pp. 520-538; Apr. 1992.

Boashash; "Estimating and Interpreting the Instantaneous Frequency of a Signal—Part 2: Algorithms and Applications"; *Proceedings of the IEEE*; vol. 80, No. 4, pp. 540-568; Apr. 1992.

Cirrincione et al.; "A New Experimental Application of Least-squares Techniques for the Estimation of the Induction Motor Parameters"; *IEEE Transactions on Industry Applications*; vol. 39, No. 5, pp. 1247-1256. Sep./Oct. 2003.

Gao et al.; "A Sensorless Rotor Temperature Estimator for Induction Machines Based on a Current Harmonic Spectral Estimation Scheme"; *IEEE Transactions on Industrial Electronics*; vol. 55, No. 1, pp. 407-416, Jan. 2008.

Gao et al.; "A Complex Space Vector Approach to Rotor Temperature Estimation for Line-connected Induction Machines With Impaired Cooling"; *IEEE Transactions on Industrial Electronics*, vol. 56, No. 1, pp. 239-247, Jan. 2009.

Gao et al.; "Narrowband Angle Modulations in Induction Motor Complex Current Vectors"; *In Proceedings of the 7th IEEE International Symposium on Diagnostics for Electric Machines, Power Electronics and Drives*; Cargèse, France, Aug. 31-Sep. 3, 2009.

Hsieh et al.; "Phase-Locked Loop Techniques—A Survey"; *IEEE Transactions on Industrial Electronics*; vol. 43, No. 6, Dec. 1996.

Lu et al., "A Nonintrusive and In-service Motor-efficiency Estimation Method Using Air-gap Torque With Considerations of Condition Monitoring"; *IEEE Transactions on Industry Applications*; vol. 44, No. 6, pp. 1666-1674, Nov./Dec. 2008.

Oppenheim et al.; "Discrete-Time Signal Processing", $2^{ed.}$ ed. Upper Saddle River; NJ: Prentice-Hall, 1999, pp. 347-348.

Peng et al.; "Generalized Instantaneous Reactive Power Theory for Three-phase Power Systems"; *IEEE Transactions on Instrumentation and Measurement*; vol. 45, No. 1, pp. 293-297, Feb. 1996.

Ribeiro et al.; "Parameter Sensitivity of MRAC Models Employed in IFO-Controlled AC Motor Drive"; *IEEE Transactions on Industrial Electronics*; vol. 44, No. 4, pp. 536-545, Aug. 1997.

Salamah et al.; "Three-phase Phase-lock Loop for Distorted Utilities,"; *IET Elect. Power Appl.*; vol. 1, No. 6, pp. 937-945, Nov. 2007.

Stephan et al.; "Real-time Estimation of the Parameters and Fluxes of Induction Motors"; *IEEE Transactions on Industry Applications*; vol. 30, No. 3, pp. 746-759, May/Jun. 1994.

Willems; "A New Interpretation of the Akagi-Nabae Power Components for Nonsinusoidal Three-Phase Situations"; *IEEE Transactions on Instrumentation and Measurement*; vol. 41, No. 4, pp. 523-527, Aug. 1992.

* cited by examiner

COMPLEX ADAPTIVE PHASE DISCRIMINATOR

FIELD OF THE INVENTION

The present disclosure relates generally to estimating instantaneous frequency of a complex dynamic signal, and more particularly to systems, methods, and devices for extracting accurate instantaneous frequency estimates of complex exponential components.

BACKGROUND

Robust accurate transient slip estimation is fundamental to achieving a significant measure of success in several types of motor analysis. Established techniques often explicitly or implicitly assume stationary or quasi-stationary motor operation. In practicality, however, motor and load environments are dynamic and dependent on a myriad of variables, such as internal and external temperature, varying load dynamics, fundamental frequency and voltage, etc. The cumulative effects of such variations can have a significant detrimental effect on many types of motor analysis.

Model Referencing Adaptive System (MRAS) is a method of iteratively adapting an electrical model of a three-phase induction motor with significant performance advantages over competitive approaches assuming quasi-stationary motor operation, as the assumption of stationary operation is often violated, with detrimental effect on model accuracy. MRAS is highly dependent upon availability of robust transient slip estimation. Applications benefiting from accurate transient slip estimation include, but are not limited to, synthesis of high quality electrical and thermal motor models, precision electrical speed estimation, dynamic efficiency and output power estimation, and inverter-fed induction machines employing vector control.

Slip estimation can be performed by passive analysis of the voltage and current signals of a three-phase induction motor, and commonly available motor-specific parameters. In a stationary environment, slip estimation accuracy is optimized by increasing the resolution of the frequency, or degree of certainty of the frequency estimate. As motor operation is typically not stationary, robust slip estimation also depends upon retention of sufficient temporal resolution, such that the unbiased transient nature of the signal is observed.

Frequency estimation is commonly performed by Fourier analysis. Fourier analysis is frame-based, operating on a contiguous temporal signal sequence defined over a fixed period of observation. Frequency resolution, defined as the inverse of the period of observation, can be improved by extending the period of observation, and moderate improvement in effective frequency resolution can be realized through local frequency interpolation and other techniques that are generally dependent on a priori knowledge of the nature of the observed signal.

In Fourier analysis, it is implicit that source signals are stationary over the period of observation, or practically, that they are stationary over contiguous temporal sequences that commonly exceed the period of observation in some statistical sense. Fourier analysis can be inappropriate for application in environments where a signal of interest violates the stationary condition implicit in the definition of a specific period of observation. Such instances may result in an aggregate frequency response and loss of transient information determined to be important to analysis. Fourier analysis presents a temporal range versus frequency resolution dilemma. At periods of observation to resolve a saliency harmonic frequency with sufficient accuracy, the stationary condition is violated and important transient information is not observable.

An effective saliency harmonic frequency resolution of less than 0.1 Hz may be defined to be minimally sufficient, resulting in a requisite period of observation of 10 seconds, which may be reduced to no less than 1.0 second through application of local frequency interpolation. However, saliency harmonic frequency variations exceeding 10.0 Hz are not uncommon. The relative transient nature of such signals violates the stationary condition requirement implicit in the definition of the minimum period of observation. Fourier analysis is not suitable for employment in robust accurate slip estimation, in applications where preservation of significant transient temporal response is important.

In a stationary environment, frequency estimation accuracy is optimized by increasing the resolution of the frequency, or degree of certainty of the frequency estimate. As motor operation is typically not stationary, robust frequency estimation also depends upon retention of sufficient temporal resolution, such that the unbiased transient nature of the signal is observed. Conventional frequency estimation methods, including the Fourier transform, provide aggregate frequency estimations, which lack the requisite temporal resolution and require impractically long periods of observation to provide minimally sufficient frequency resolution. There is therefore a continuing need for more robust and efficient means of accurately estimating the instantaneous frequency of a dynamic complex signal.

SUMMARY

A Complex Adaptive Phase Discriminator (PD), as presented in some aspects of the present disclosure, is an adaptive filter that accurately estimates the instantaneous frequency of a dynamic complex signal. The PD demonstrates accurate instantaneous frequency estimation and rapid convergence in dynamic complex signal environments, when the frequency of its input may change rapidly. In some exemplary configurations, Complex Adaptive PDs employ novel architectures and means of adaptation to estimate instantaneous frequency with performance that is computationally efficient and qualitatively superior relative to other known methods. Performance is computationally efficient and qualitatively superior, in some implementations, because essential information defining the dynamic nature of a motor system is preserved, while retaining the accuracy required to support advanced motor modeling and analysis applications, in a form suitable for modest, practical embedded implementation.

Also disclosed herein are efficient complex normalization and complex normalized phase approximations that are developed to support implementation in computationally restrictive environments, including systems with real-time response constraints, and systems without efficient native or functional support for division, square root, or trigonometric operations.

Indirect and direct PD architectures are featured that can be repetitively applied to extract an instantaneous normalized frequency estimate of a synthetic FM complex primary signal. For instance, the complex primary signal is constructed with a normalized carrier frequency equal to zero, a normalized modulation frequency equal to 0.01, and a modulation index equal to 0.5. This results in a complex FM signal at complex baseband, with modulation that significantly exceeds the levels observed in residual complex current signals of induction motors. The L1 norm or mean absolute frequency estimation error is on the scale of 1.0e-17, or 1.0e-6, representing approximately 55 and 20 bits of dynamic range, for indirect and direct PD architectures, respectively.

In some configurations, the direct PD architecture estimates the instantaneous frequency of a complex primary signal, iteratively adapting the phase of a complex exponential by minimizing the mean squared error of a complex error signal. In this instance, instantaneous frequency can be directly estimated from the phase of the complex exponential. In some configurations, the indirect PD architecture estimates the instantaneous frequency of a complex primary signal, iteratively adapting a complex coefficient by minimizing the mean squared error of a complex error signal. In this instance, instantaneous frequency can be indirectly estimated by extracting the phase of the complex coefficient.

Direct and indirect PD architectures provide developers with the opportunity to select the most appropriate construction to meet the needs of a specific application. The direct PD architecture supports simple, practical implementation in environments with minimal computational resources. The indirect PD architecture allows reduced frequency estimation error, relative to the direct PD architecture, at the expense of increased computational and developmental complexity, as a complex normalized phase operation is required.

Efficient complex normalization and complex normalized phase approximations can be developed to support practical PD implementation in computationally restrictive environments, including systems with real-time response constraints, and systems without efficient native or functional support for division, square root, or trigonometric operations.

Applications benefiting from employment of the adaptive complex PD are extensive and diverse, including accurate instantaneous frequency estimation, and control and communications applications. A few practical applications for Complex Adaptive PDs include, for example, induction motor fundamental frequency and saliency frequency estimation from complex voltage and complex current signals.

According to some aspects of the present disclosure, a method of estimating an instantaneous frequency of a complex primary signal is presented. The method includes: determining a normalized complex primary signal based, at least in part, on the complex primary signal; determining a normalized complex incident signal based, at least in part, on the normalized complex primary signal; determining a complex reference signal based, as at least in part, on the normalized complex incident signal; determining a complex error signal based, at least in part, on the normalized complex primary signal and the complex reference signal; minimizing an error of the complex error signal; iteratively adapting a complex coefficient or a normalized phase of a complex exponential, the iteratively adapting being based, at least in part, on the minimized error; estimating the instantaneous frequency of the complex primary signal, the estimating being directly from the normalized phase or indirectly by extracting a phase of the complex coefficient; and storing the estimated instantaneous frequency According to other aspects of the present disclosure, a method is presented for estimating an instantaneous frequency of a complex primary signal associated with an induction motor. The method includes: receiving the complex primary signal; normalizing the complex primary signal to generate a normalized complex primary signal; delaying the normalized complex primary signal by a predetermined unit to generate a normalized complex incident signal; calculating a complex reference signal, the complex reference signal being the product of the normalized complex incident signal and one of a complex exponential and a complex coefficient; calculating a complex error signal, the complex error signal being the difference between the normalized complex primary signal and the complex reference signal; iteratively adapting the complex coefficient or a normalized phase of the complex exponential, the iteratively adapting being based, at least in part, on an estimate of a gradient of a performance surface scaled by a constant rate of adaptation; estimating the instantaneous frequency of the complex primary signal, the estimating being directly from the normalized phase or indirectly by extracting a phase of the complex coefficient; and storing the estimated instantaneous frequency.

The above summary is not intended to represent each embodiment or every aspect of the present disclosure. Rather, the foregoing summary merely provides an exemplification of some of the novel features disclosed herein. The above features and advantages, and other features and advantages of the present disclosure, will be readily apparent from the following detailed description of the exemplary embodiments and best modes for carrying out aspects of the present invention when taken in connection with the accompanying drawings and appended claims.

Figure 1:
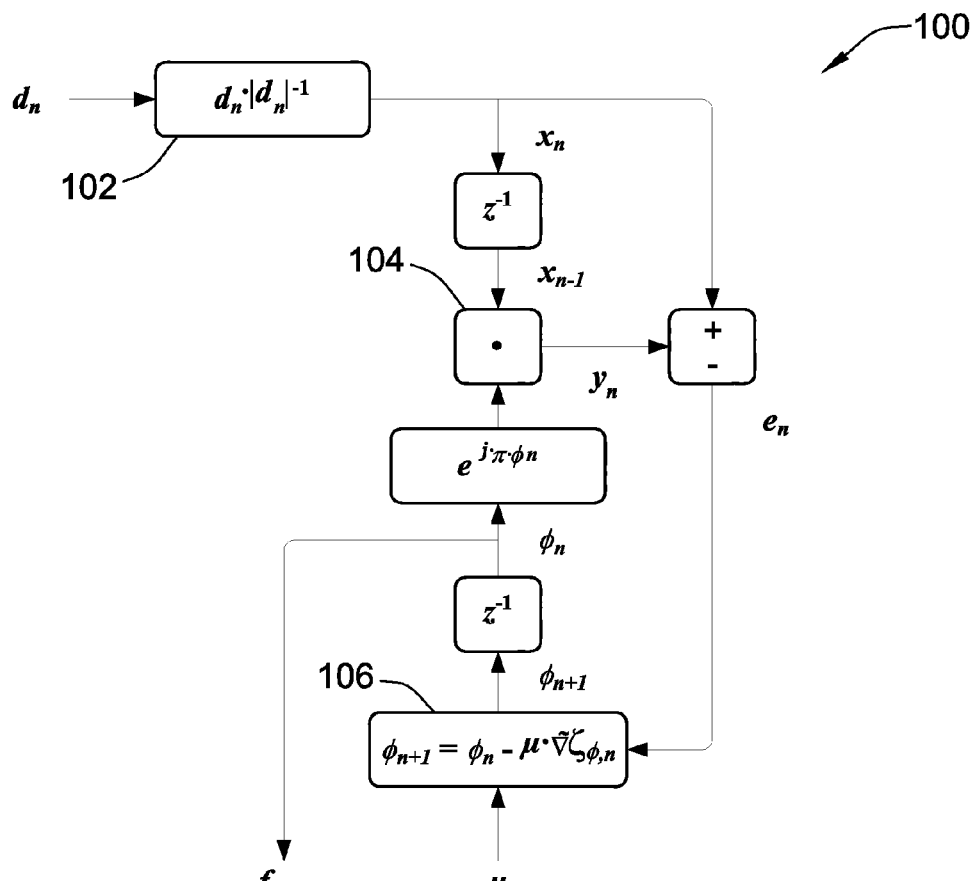
FIG. 1 is a schematic block diagram showing the overall architecture of an exemplary direct phase discriminator.

While the present disclosure is susceptible to various modifications and alternative forms, specific embodiments have been shown by way of example in the drawings and will be described in detail herein. It should be understood, however, that the disclosure is not intended to be limited to the particular forms disclosed. Rather, the disclosure is to cover all modifications, equivalents, and alternatives falling within the spirit and scope of the invention as defined by the appended claims.

DETAILED DESCRIPTION OF THE EXEMPLARY EMBODIMENTS

A Complex Adaptive Phase Discriminator (PD), as presented in some aspects of the present disclosure, is an adaptive filter that accurately estimates the instantaneous frequency of a dynamic complex signal. The PD can demonstrate accurate instantaneous frequency estimation and rapid convergence in dynamic complex signal environments, even when the input frequency rapidly changes. The Complex Adaptive PD can support native processing of complex signals to extract accurate instantaneous frequency estimates of complex exponential components in a flexible and computationally efficient form. The architectures and means of adaptation are unique and have broad applicability in many application domains.

An indirect PD architecture can estimate the instantaneous frequency of a complex primary signal, iteratively adapting a complex coefficient by minimizing the magnitude of a complex error signal. Instantaneous frequency can be indirectly estimated by extracting the phase of the complex coefficient. An indirect PD architecture can provide accurate instantaneous frequency estimation and rapid convergence in dynamic complex signal environments. The indirect PD architecture often requires moderate computational and developmental complexity, as a complex normalized phase operation is often required. If an accurate, efficient complex normalized phase approximation is necessary, resulting increases in design complexity, requisite development skill, development time, and maintenance, may not justify modest improvements in computational complexity in environments with modest computational resources.

Extraction of the instantaneous normalized frequency often requires a complex normalized phase operation. Efficient complex normalized phase approximation is often required to support implementation in computationally restrictive environments, including systems with real-time response constraints, and systems without efficient native or functional support for division or trigonometric operations. A polynomial filter bank can be applied to accurately approximate the normalized phase of a complex input by abasing and subsequently reconstructing the phase of the complex input to restrict its range and reduce approximation error, eliminating the necessity to directly support division or trigonometric operations.

A direct PD architecture can estimate the instantaneous frequency of a complex primary signal, iteratively adapting the phase of a complex exponential by minimizing the magnitude of a real or complex error signal. Instantaneous frequency can be directly estimated from the phase of the complex exponential. Two variations of the direct PD architecture are developed, with alternative error definitions, based on a complex cross product and a complex difference.

The direct PD architecture can provide accurate instantaneous frequency estimation and rapid convergence in dynamic complex signal environments, while eliminating specific relative limitations, moderate computational and design complexity, observed in the indirect PD architecture. The direct PD architecture can achieve significant reductions in requisite computational and developmental complexity, as complex normalized phase support is not necessary. Performance surface gradient estimations are comparatively simple, and the additional requirement to support complex exponential synthesis as a function of normalized phase imposes a negligible computational burden, in the form of a linear indexed table. The direct PD architecture can support trivial implementation in environments with minimal computational resources.

Efficient complex normalization and complex normalized phase approximations are developed to support implementation in computationally restrictive environments, including systems with real-time response constraints, and systems without efficient native or functional support for division, square root, or trigonometric operations.

Complex normalized phase approximation is extremely accurate. For example, in some configurations, complex normalized phase approximation exhibits an estimation accuracy demonstrating over 55 bits of dynamic range, with the computational expense of a 4th order polynomial.

The computational complexity of an indirect PD architecture can be reduced by 1-2 orders of magnitude when employing complex normalization and complex normalized phase approximation. The indirect PD architecture can demonstrate superior efficiency by requiring only complex normalization approximation, and demonstrating relatively simple adaptation rules. Alternative architectures provide the designer with the opportunity to flexibly specify requisite accuracy and computational efficiency for a specific application.

Complex Adaptive Phase Discriminator

Concepts of normalized frequency, normalized phase, complex dot and cross products, norms, and complex frequency modulation are introduced as convenient constructs in the subsequent definitions.

As seen in equation (1.1), below, normalized frequency, f, is the absolute frequency, $f_A$, divided by the Nyquist frequency, $f_N$, or ½ the sampling frequency, and is generally defined over the range [−1, 1], corresponding to the absolute frequency range [−0.5·$f_s$, 0.5·$f_s$] Hz.

$$f = \frac{f_A}{f_N} = \frac{2 \cdot f_A}{f_S} \tag{1.1}$$

Normalized phase, $\phi$, as seen in equation (1.2), below, is the absolute phase divided by $\pi$, and is defined over the range [−1, 1], corresponding to the absolute phase range [−$\pi$,$\pi$] radians.

$$\phi = \frac{\phi_{RAD}}{\pi} \tag{1.2}$$

According to equation (1.3), below, normalized frequency, $f_n$, is defined as the discrete time derivative of the normalized phase, $\phi_n$, with respect to sample index n.

$$f_n = \frac{d}{dn}(\phi_n) \tag{1.3}$$

Dot product and cross product can be defined as vector operators, with two vector arguments defined in a three-dimensional Euclidean space. For the purpose of notational simplification, it can be convenient to define dot product and cross product as complex operators, with two complex quantities as inputs, producing real results. Vector inputs are constructed from the orthogonal real and imaginary components of the complex quantities, projected into a Euclidean space.

The complex dot product operator, $\Theta$, represents the tangential component of the product of two complex inputs, x and y, as seen below in equation (1.4). Real and imaginary components of the two complex inputs, x and y, are defined by $x_{RE}$ and $x_{IM}$, and $y_{RE}$ and $y_{IM}$, respectively. The complex dot product is commutative.

$$xy=x^*y^*=yx=x_{RE}\cdot y_{RE}+x_{IM}\cdot y_{IM} \qquad (1.4)$$

Equation (1.5), which is presented below, demonstrates that the complex cross product operator, $\otimes$, represents the normal component of the product of two complex inputs, x and y. In contrast to the complex dot product, the complex cross product is not commutative.

$$x \otimes y = -x^* \otimes y^* = -y \otimes x = x_{RE}\cdot y_{IM} - x_{IM}\cdot y_{RE} \qquad (1.5)$$

It is often convenient to express complex multiplication in terms of complex dot product and cross product operations. In equation (1.6), substituting (1.4) and (1.5) expressed in terms of x* and y.

$$x\cdot y = (x_{RE}\cdot y_{RE} - x_{IM}\cdot y_{IM}) + j\cdot(x_{RE}\cdot y_{IM} + x_{IM}\cdot y_{RE}) = (x^*y) + j\cdot(x^* \otimes y) \qquad (1.6)$$

A norm is a measure of difference between two signals, a primary signal, and an estimated reference signal, over some period of observation. The norm is an aggregate or statistical representation of the difference, or error. Norm specifications commonly employed include $L_1$, representing the mean absolute error, $L_2$, representing the mean squared error, and $L_\infty$, representing the maximum absolute error.

The $L_1$ norm of normalized frequency estimation is defined as the mean absolute error, or difference between a primary signal, $x_n$, and an estimated reference signal, $y_n$, over a period of observation, N, as seen in equation (1.7).

$$L_1 = \left(\frac{1}{N}\right) \cdot \sum_{n=0}^{N-1} |x_n - y_n| \qquad (1.7)$$

The $L_2$ norm of normalized frequency estimation is defined as the mean squared error, or difference between a primary signal, $x_n$, and an estimated reference signal, $y_n$, over a period of observation, N, as seen in equation (1.8).

$$L_2 = \left(\frac{1}{N}\right) \cdot \sum_{n=0}^{N-1} (x_n - y_n) \cdot (x_n \cdot y_n)^* \qquad (1.8)$$

The $Lc_\infty$ norm of normalized frequency estimation is defined as the maximum absolute error, or difference between a primary signal, $x_n$, and an estimated reference signal, $y_n$, over a period of observation, N, as seen in equation (1.9).

$$L_\infty = \text{MAX}(|x_n - y_n|) n:[0, N-1] \qquad (1.9)$$

Frequency Modulated (FM) instantaneous normalized frequency, $f_{\beta,n}$, is defined in equation (1.10), below, as a function of normalized carrier frequency, $f_c$, normalized modulation frequency, $f_m$, and modulation index, $\beta$, with respect to sample index n.

$$f_{\beta,n} = f_c + \oplus \cdot f_m \cos(\pi \cdot f_m \cdot n) \qquad (1.10)$$

A complex FM signal, $x_{\beta,n}$, is synthesized as the complex exponential of normalized frequency, $f_{\beta,n}$, at a random initial normalized phase, $\phi_0$, as seen in equation (1.11).

$$x_{\beta,n} = e^{j \cdot \pi \cdot (f_{\beta,n} \cdot n + \phi_0)} \qquad (1.11)$$

Complex FM signals are used in the verification and characterization of PD constructions.

Direct Phase Discriminator Architecture

FIG. 1 is a schematic block diagram showing the overall architecture of an exemplary direct phase discriminator, designated generally as 100. The direct PD architecture illustrated in FIG. 1 can estimate the instantaneous frequency of a complex primary signal, iteratively adapting the phase of a complex exponential by minimizing the $L_2$ norm of a complex error signal. Instantaneous frequency can be directly estimated from the phase of the complex exponential.

Complex primary signal, $d_n$, is an external time-varying sampled input to the direct PD 100. A normalized complex primary signal, $x_n$, is a representation of the external complex primary signal, normalized to unity magnitude.

In FIG. 1, complex reference signal, $y_n$, is the product of a complex exponential of an iterative normalized phase estimate, $\phi_n$, and a normalized complex incident signal, $x_{n-1}$, which is equal to a unit delayed normalized complex primary signal.

Complex error signal, $e_n$, is the difference between the normalized complex primary signal, $x_n$, and the complex reference signal, $y_n$.

Normalized phase, $\phi_n$, is iteratively adapted to minimize the $L_2$ norm of the complex error, $e_n$, which occurs when the normalized phase approximates the normalized phase difference between the normalized complex primary signal, $x_n$, and the complex incident signal, $x_{n-1}$.

Instantaneous normalized frequency, $f_n$, of the complex primary signal, $d_n$, is directly estimated in FIG. 1 from the discrete derivative of its normalized phase.

The direct PD 100 demonstrates accurate instantaneous frequency estimation and rapid convergence in dynamic complex signal environments even when the frequency of its input may change rapidly. The direct PD architecture illustrated in FIG. 1 allows reduced computational and developmental complexity, relative to the indirect PD architecture, at the expense of increased frequency estimation error.

The direct PD architecture can achieve significant reductions in requisite computational and developmental complexity, as complex normalized phase support is not necessary. Performance surface gradient estimations are comparatively simple, and the additional requirement to support complex exponential synthesis as a function of normalized phase imposes a negligible computational burden, typically in the form of a linear indexed table. The direct PD architecture supports, for example, simple, practical implementation in environments with minimal computational resources.

With continued reference to FIG. 1, an external complex primary signal, $d_n$, is normalized at block 102 to construct a unity magnitude normalized complex primary signal, $x_n$, as seen in equation (1.12), below. Complex normalization of the complex primary signal preserves phase and frequency content, and eliminates magnitude variation.

$$x_n = \frac{d_n}{|d_n|} = d_n \cdot (|d_n|^2)^{-0.5} = d_n \cdot (d_{RE,n}^2 + d_{IM,n}^2)^{-0.5} \qquad (1.12)$$

Division of the complex primary signal by the square root of its magnitude squared is implicit in complex normalization. Efficient complex normalization approximation is often required to support implementation in computationally restrictive environments, including systems with real-time response constraints, and systems without efficient native or functional support for division or square root operations.

An iterative application of Newton's method for inverse square root approximation, applied to the squared magnitude of the complex primary signal, eliminates the necessity to directly support division or square root operations. Complex normalization approximation is defined below.

A complex reference signal, $y_n$, is constructed at block 104 as the product of a normalized complex incident signal, $x_{n-1}$, and a complex exponential which operates on an adaptive normalized phase, $\phi_n$, as seen in equation (1.13).

$$y_n = x_{n-1} \cdot e^{j \cdot \pi \cdot \phi_n} = x_{n-1} \cdot (\cos(\pi \cdot \phi_n) + j \cdot \text{SIN}(\pi \cdot \phi_n)) = y_{RE,n} + j \cdot y_{IM,n} \quad (1.13)$$

In environments where efficient complex exponential synthesis is not available, the complex exponential operation may be accurately and efficiently approximated in the form of an indexed table, at any resolution required, limited only by available storage and numerical representation.

Absent a priori knowledge, the initial normalized phase, $\phi_0$, is assigned a random value in equation (1.14).

$$\phi_0 = \text{RAND}(-1,1) \quad (1.14)$$

Normalized Phase Adaptation

A performance surface is a concept that defines a positive real contiguously differentiable function of the adaptive parameters of a system, which possesses an absolute minimum at the optimum adaptive parameter solution. Further, the performance surface can be required to be convex to eliminate the definition of local minima which would otherwise interfere with convergence about the optimum adaptive parameter solution.

Gradient descent adaptation is based on the principle of iteratively estimating the gradient of the performance surface, and updating the adaptive parameters to traverse the performance surface in the opposite direction to the gradient estimate. The performance surface for a specific system is generally not known a priori, yet an accurate and often efficient gradient estimate may be constructed, revealing a path to the minimum of the performance surface, corresponding to the optimum adaptive parameter solution.

The performance surface is generally defined as a function of error, or a measure of success in reconciling signals of interest, which is itself a function of the adaptive parameters of a system. It is often productive to develop alternative performance surface and error definitions, as these definitions affect both the computational complexity and practical considerations related to implementation, as well as important functional concerns including convergence and misadjustment.

Definition of a suitable error function is subjective, though certain constraints are required to accommodate the application of gradient descent adaptation. To form an adaptation rule for the normalized phase, the error function must be a contiguously differentiable function of the normalized phase, and possess a single root at an optimum normalized phase selection.

Complex Difference Error

A complex error signal, $e_n$, is defined in equation (1.15) as the complex difference between the normalized complex primary signal, $x_n$, and the complex reference signal, $y_n$, substituting equation (1.13).

$$e_n = x_n - y_n = x_n - x_{n-1} \cdot e^{j \cdot \pi \cdot \phi_n} \quad (1.15)$$

The complex error is minimized when the complex reference signal closely approximates the normalized complex primary signal. The minimum error condition is achieved when the normalized phase converges to an optimum solution, where the normalized phase approximates the difference in phase between two adjacent samples of the complex primary signal. As the complex primary signal is normalized, to minimize the difference between the normalized complex primary and complex reference signals, the optimum normalized phase solution must provide the necessary phase rotation, or difference, without modifying the magnitude. A distinguishing feature of the direct PD architecture, as exemplified in FIG. 1, is the independence of the adaptive parameter from the magnitude of the complex reference signal.

The direct PD architecture performance surface, $\zeta_{\phi,n}$, is equal to the product of the complex error signal, $e_n$, and the conjugate complex error, $e_n^*$, and forms a real convex function of the normalized phase, with a global minimum at the optimum normalized phase solution. This relationship can be seen in equation (1.16), which then substitutes equations (1.15) and (1.4).

$$\zeta_{\phi,n} = e_n \cdot e_n^* \quad (1.16)$$
$$= x_n \cdot x_n^* + y_n \cdot y_n^* - 2 \cdot (x_{RE,n} \cdot y_{RE,n} + x_{IM,n} \cdot y_{IM,n})$$
$$= |x_n|^2 + |y_n|^2 - 2 \cdot (x_n \quad y_n)$$

The partial derivative of the complex reference signal, $y_n$, with respect to the normalized phase provides a convenient simplification of the subsequent definition of the gradient of the performance surface, as seen in equation (1.17), below.

$$\frac{\partial}{\partial \phi}(y_n) = \frac{\partial}{\partial \phi}(y_{RE,n}) + j \cdot \frac{\partial}{\partial \phi}(y_{IM,n}) \quad (1.17)$$
$$= x_{n-1} \cdot \pi \cdot (-\text{SIN}(\pi \cdot \phi_n) + j \cdot \text{COS}(\pi \cdot \phi_n))$$
$$= \pi \cdot (-y_{IM,n} + j \cdot y_{RE,n})$$

The gradient of the performance surface, $\tilde{\nabla}\zeta_{\phi,n}$, is defined as the vector on the performance surface at coordinates corresponding to the normalized phase, with an orientation corresponding to the direction of greatest increase, and a magnitude equal to the greatest rate of change, as seen in equation (1.18), substituting equations (1.17) and (1.5).

$$\tilde{\nabla}\zeta_{\phi,n} = \frac{\partial}{\partial \phi}(\zeta_{\phi,n}) \quad (1.18)$$
$$= -2 \cdot \left(x_{Re,n} \cdot \frac{\partial}{\partial \phi}(y_{RE,n}) + x_{IM,n} \cdot \frac{\partial}{\partial \phi}(y_{IM,n})\right)$$
$$= 2 \cdot \pi \cdot (x_n \otimes y_n)$$

The direct PD performance surface is a real function of normalized phase. The gradient of the performance surface is therefore expressed in terms of the partial derivative of the performance surface with respect to the normalized phase.

The normalized phase is iteratively adapted at block 106 by applying an LMS update rule, such that the unit advanced normalized phase iteration, $\phi_{n+1}$, is equal to the present normalized phase, $\phi_n$, minus an estimate of the gradient of the performance surface, $\tilde{\nabla}\zeta_{\phi,n}$, scaled by a constant rate of adaptation, $\mu$ as seen in equation (1.19), substituting equation (1.18).

$$\phi_{n+1} = \phi_n - \mu \cdot \tilde{\nabla}\zeta_{\phi,n} = \phi_n - 2 \cdot \pi \cdot \mu \cdot (x_n \otimes y_n) \quad (1.19)$$

Experimental results suggest that the maximum rate of adaptation is less than that of the indirect architecture, approximately 0.05 in equation (1.20).

$$\mu \leq 0.05 \tag{1.20}$$

Figure 2:
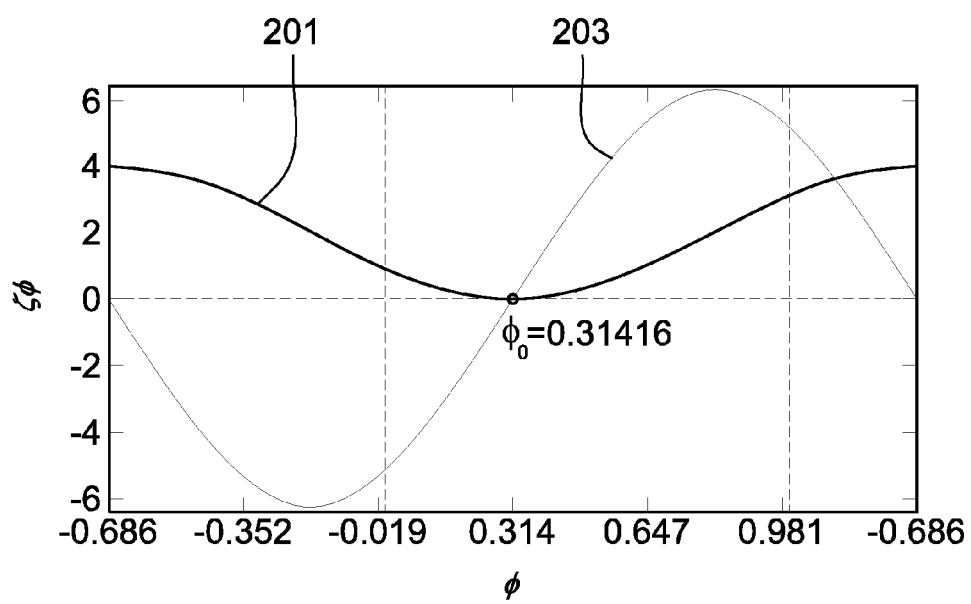
FIG. 2 is a graph showing an exemplary performance surface synthesized from a direct PD architecture.

An exemplary performance surface synthesized from a direct PD architecture is illustrated in FIG. 2. A complex primary signal is constructed with a constant normalized frequency equal to $0.1 \cdot \pi$. The normalized phase is specified over a linearly sampled range in $[-1.0, 1.0]$. The first trace 201 depicts the performance surface, whereas the second trace 203 depicts the gradient of the performance surface with respect to normalized phase.

The performance surface is specific to the complex primary signal, and illustrates the presence of a global minimum, $\phi_0$, when the normalized phase is equal to the normalized frequency of the complex primary signal. Normalized phase is contiguous across its defined range, as depicted by the light vertical trace at $\pm 1$.

Normalized Frequency Estimation

Instantaneous normalized frequency, $f_{n-0.5}$, is directly estimated from the normalized phase, $\phi_n$, in FIG. 1. The normalized phase difference over a one sample interval defines a first order discrete differentiator, which provides an approximation to the instantaneous normalized frequency of the complex primary signal. As indicated in equation (1.21) below, and illustrated in FIG. 1, the normalized frequency is equal to the normalized phase, as the normalized phase approximates the phase difference necessary to reconcile successive samples of the complex primary signal over a one sample interval. A latency of 0.5 samples is inherent in a causal first order discrete differentiator.

$$f_{n-0.5} = \frac{d}{dn}(\phi_{n-0.5}) \approx \phi_{x,n} - \phi_{x,n-1} = \phi_n \tag{1.21}$$

The direct PD architecture illustrated in FIG. 1 is repetitively applied to extract an instantaneous normalized frequency estimate of a synthetic FM complex primary signal constructed with a normalized carrier frequency, $f_c$, equal to zero, a normalized modulation frequency, $f_m$, equal to 0.01, and modulation index, $\beta$, specified over a linearly sampled range in $[0.01, 1]$. The rate of adaptation, $\mu$, is equal to 0.05. The complex primary signal is iteratively defined from a set of relatively narrow band complex FM signals at complex baseband.

Figure 3:
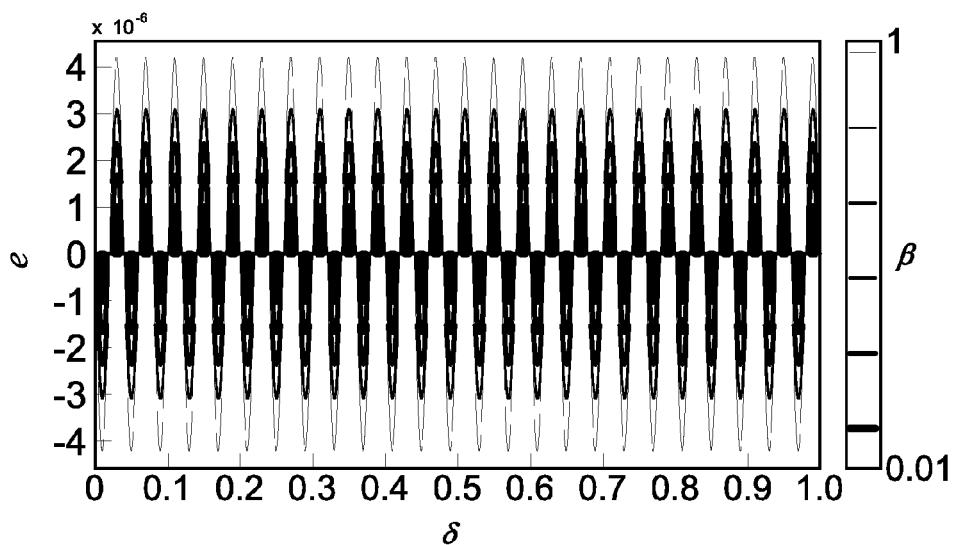
FIG. 3 is a graph showing an exemplary normalized frequency estimation error after latency compensation over a sample quantity.

The normalized frequency estimation error, or difference between the known instantaneous normalized frequency of the complex primary signal and the estimated normalized frequency, after latency compensation, is illustrated in FIG. 3 over a sample quantity equal to an arbitrary sampling rate, resulting in a period of observation of 1.0 second. Darker shaded traces correspond to signals with lower modulation index, and demonstrate lower normalized frequency estimation error. Contrastingly, lighter shaded traces correspond to signals with higher modulation index.

With a modulation index equal to 0.5, the $L_\infty$ norm of the normalized frequency estimation error is on the scale of $2.0 \cdot 10^{-6}$. At a sampling rate equal to 4.0 kHz, this condition equates to a maximum frequency estimation error of approximately $4.0 \cdot 10^{-3}$ Hz for this sequence. A more representative $L_1$ norm in a similar environment is on the scale of $1.0 \cdot 10^{-6}$, or $2.0 \cdot 10^{-3}$ Hz.

Figure 4:
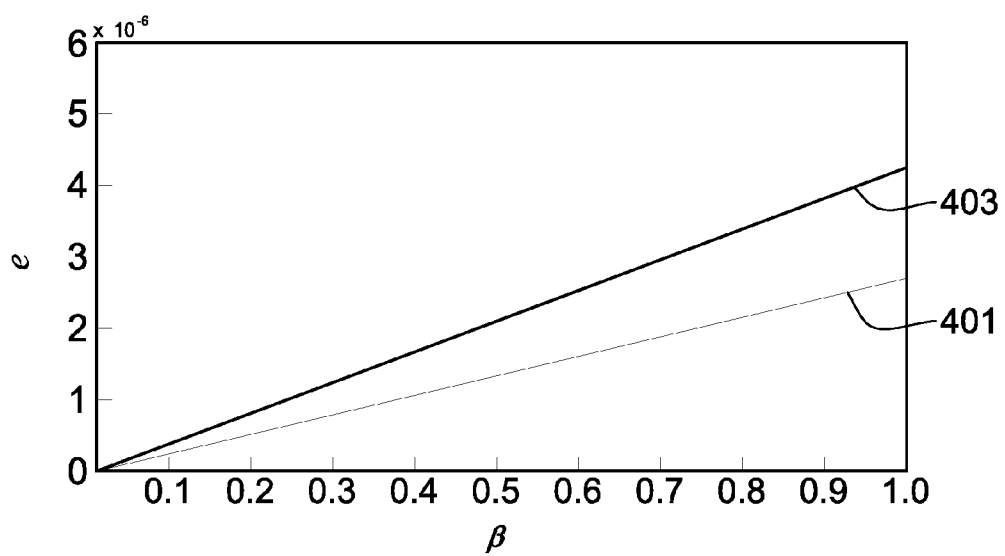
FIG. 4 is a graph showing an exemplary mean absolute error and an exemplary maximum absolute error of an exemplary normalized frequency estimation error illustrated over a set of complex FM signals specified over a linearly sampled range.

The $L_1$ and $L_\infty$ norm of the normalized frequency estimation error is illustrated over the set of complex FM signals previously defined, with modulation index, $\beta$, specified over a linearly sampled range in $[0.01, 1.0]$, as shown in FIG. 4. The first trace 401 depicts the $L_1$ norm, and the second trace 403 depicts the $L_\infty$ norm of the normalized frequency estimation error with respect to modulation index. A direct PD implementation employing complex normalization approximation will eliminate the application of division and square root operations employed in the otherwise identical ideal construction. Complex normalization approximation is defined below.

The normalized frequency estimation norm in the direct PD implementation employing approximations is essentially unchanged relative to the ideal implementation, as complex normalized phase approximation, the most significant source of approximation error in the indirect PD architecture, is not required in direct PD constructions. This is an important observation, as a practical implementation of the direct PD architecture typically would not suffer to any appreciable degree from approximation error.

Observed dependence of the direct PD on modulation index is significantly higher than noted in the indirect PD, indicating that the direct PD has a lower frequency tracking rate. The assumption the complex primary signals applied may be considered to vary slowly relative to adaptation and convergence is signal dependent. Error and norm analysis indicates that frequency estimation accuracy of the direct PD architecture is more than sufficient for many applications, while providing significant reduction in computational and developmental complexity, and relatively low approximation error associated with practical implementation.

Normalized frequency estimation is sufficiently accurate such that resulting errors are small enough be deemed negligible, in many environments, relative to other existing sources of error, including numerical representation and finite word length effects. A signed error on the scale of $2.0 \cdot 10^{-6}$ represents approximately 20 bits of dynamic range.

Indirect Phase Discriminator Architecture

Figure 5:
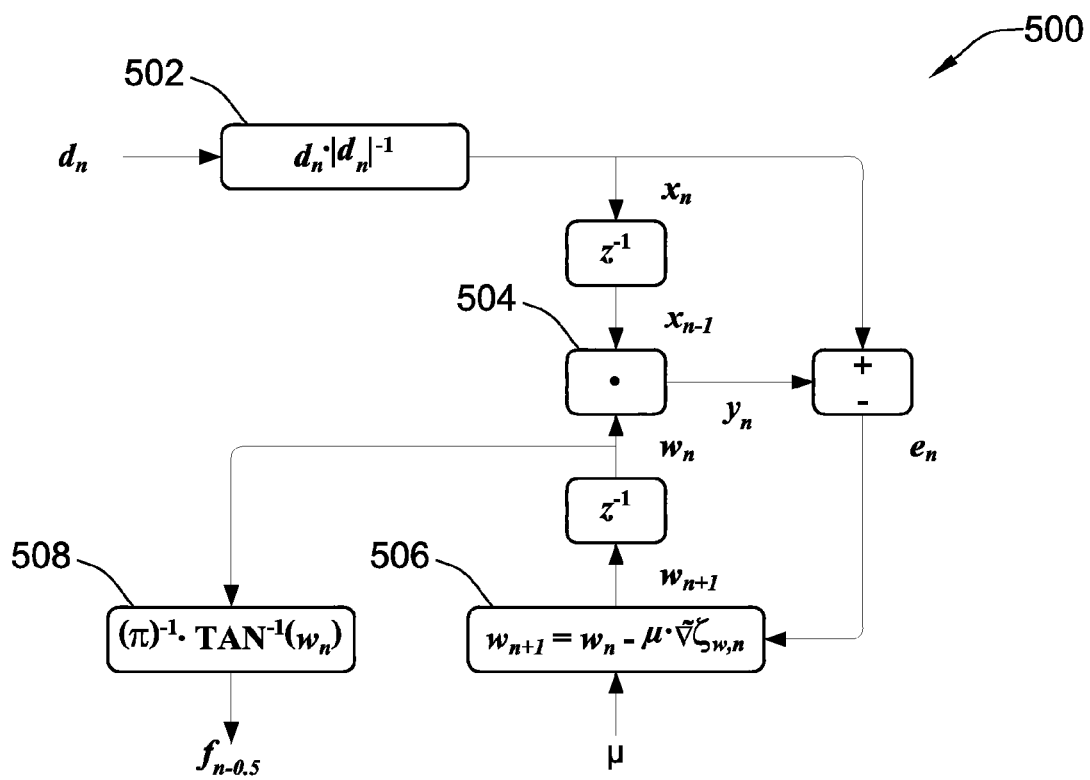
FIG. 5 is a schematic block diagram showing the overall architecture of an exemplary indirect phase discriminator.

FIG. 5 is a schematic block diagram showing the overall architecture of an exemplary indirect phase discriminator, designated generally as 500. The indirect PD architecture illustrated in FIG. 5 can estimate the instantaneous frequency of a complex primary signal, iteratively adapting a complex coefficient by minimizing the $L_2$ norm of a complex error signal. Instantaneous frequency can be indirectly estimated by extracting the phase of the complex coefficient.

Complex primary signal, $d_n$, is an external time-varying sampled input to the indirect PD 500. A normalized complex primary signal, $x_n$, is a representation of the external complex primary signal, normalized to unity magnitude.

In FIG. 5, complex reference signal, $y_n$, is the product of an adaptive complex coefficient, $w_n$, and a normalized complex incident signal, $x_{n-1}$, which is equal to a unit delayed normalized complex primary signal.

Similar to FIG. 1, complex error signal, $e_n$, of FIG. 5 is the difference between the normalized complex primary signal, $x_n$, and the complex reference signal, $y_n$.

Complex coefficient, $w_n$, is iteratively adapted to minimize the $L_2$ norm of the complex error, $e_n$, which occurs when the normalized phase of the complex coefficient approximates the normalized phase difference between the normalized complex primary signal, $x_n$, and the complex incident signal, $x_{n-1}$.

Instantaneous normalized frequency, $f_n$, of the complex primary signal, $d_n$, is indirectly estimated in FIG. 5 from the discrete derivative of its normalized phase, extracted from the phase of the complex coefficient, $w_n$, by a trigonometric operation.

The indirect PD 500 demonstrates accurate instantaneous frequency estimation and rapid convergence in dynamic complex signal environments even when the frequency of its input may change rapidly. The indirect PD architecture illustrated in FIG. 5 allows reduced frequency estimation error, for example, relative to the direct PD architecture, at the expense of increased computational and developmental complexity.

The indirect PD architecture often requires moderate computational and developmental complexity, as a complex normalized phase operation is required. If an accurate, efficient complex normalized phase approximation is necessary, resulting increases in design complexity, requisite development skill, time, and maintenance, generally should be justified by the relative improvements in frequency estimation accuracy and tracking rate, especially in environments with modest computational resources.

With continued reference to FIG. 5, an external complex primary signal, $d_n$, is normalized at block 502 to construct a unity magnitude normalized complex primary signal, $x_n$, as seen in equation (1.22), below. Complex normalization of the complex primary signal preserves phase and frequency content, and eliminates magnitude variation.

$$x_n = \frac{d_n}{|d_n|} = d_n \cdot (|d_n|^2)^{-0.5} = d_n \cdot (d_{RE,n}^2 + d_{IM,n}^2)^{-0.5} \quad (1.22)$$

Division of the complex primary signal by the square root of its magnitude squared is implicit in complex normalization. Efficient complex normalization approximation is required to support implementation in computationally restrictive environments, including systems with real-time response constraints, and systems without efficient native or functional support for division or square root operations.

An iterative application of Newton's method for inverse square root approximation, applied to the squared magnitude of the complex primary signal, eliminates the necessity to directly support division or square root operations. Complex normalization approximation is defined below.

A complex reference signal, $y_n$, is constructed at block 504 as the product of a complex incident signal, $x_{n-1}$, and an adaptive complex coefficient, $w_n$, as seen in equation (1.23).

$$y_n = x_{n-1} \cdot w_n \quad (1.23)$$

Absent a priori knowledge, the initial complex coefficient, $w_0$, is assigned a complex exponential value with unity magnitude at a random or arbitrarily predefined initial phase, as seen in equation (1.24).

$$w_0 = e^{j \cdot \pi \cdot RAND(-1,1)} \quad (1.24)$$

Complex Coefficient Adaptation

As noted above in the discussion of Normalized Phase Adaptation, a performance surface is a concept that defines a positive real contiguously differentiable function of the adaptive parameters of a system, which possesses an absolute minimum at the optimum adaptive parameter solution. Further, we may elect to require the performance surface to be convex, eliminating the definition of local minima which could otherwise interfere with convergence about the optimum adaptive parameter solution.

Gradient descent adaptation is based on the principle of iteratively estimating the gradient of the performance surface, and updating the adaptive parameters to traverse the performance surface in the opposite direction to the gradient estimate. The performance surface for a specific system is generally not known a priori, yet an accurate and often efficient gradient estimate may be constructed, revealing a path to the minimum of the performance surface, corresponding to the optimum adaptive parameter solution.

The performance surface is generally defined as a function of error, or a measure of success in reconciling signals of interest, which is itself a function of the adaptive parameters of a system. It is often productive to develop alternative performance surface and error definitions, as these definitions affect both the computational complexity and practical considerations related to implementation, as well as important functional concerns including convergence and misadjustment.

Definition of a suitable error function is subjective, though certain constraints are required to accommodate the application of gradient descent adaptation. To form an adaptation rule for the complex coefficient, the error function must be a contiguously differentiable function of the complex coefficient, and possess a single root at an optimum complex coefficient selection.

Complex Difference Error

A complex error signal, $e_n$, is defined in equation (1.25) as the difference between the normalized complex primary signal, $x_n$, and the complex reference signal, $y_n$, substituting equation (1.23).

$$e_n = x_n - y_n = x_n - x_{n-1} \cdot w_n \quad (1.25)$$

The complex error is minimized when the complex reference signal closely approximates the normalized complex primary signal. The minimum error condition is achieved when the complex coefficient converges to an optimum solution, where the phase of the complex coefficient approximates the difference in phase between two adjacent samples of the complex primary signal. As the complex primary signal is normalized, to minimize the difference between the complex primary and reference signals, the optimum complex coefficient solution must implicitly provide the necessary phase rotation, without modifying the magnitude.

The complex coefficient and the complex reference signal, in a properly constructed system, can be expected to retain unity magnitude with dynamic phase. As the complex coefficient must retain unity magnitude to minimize the complex error, misadjustment and finite word length effects combine to allow the possibility of magnitude bias in the complex reference signal, which could contribute to normalized phase and instantaneous frequency estimation error.

The sum of products expressed in terms of the normalized complex primary signal, $x_n$, and the complex incident signal, $x_{n-1}$, is equivalent to the simplified complex dot product expression. This relationship can be seen in equation (1.26), which then substitutes equations (1.6), (1.4), and (1.5).

$$\begin{aligned} x_n^* \cdot x_{n-1} + x_n \cdot x_{n-1}^* &= (x_n \quad x_{n-1}) + j \cdot (x_n \otimes x_{n-1}) + \\ &\quad (x_n^* \quad x_{n-1}^*) + j \cdot (x_n^* \otimes x_{n-1}^*) \\ &= (x_n \quad x_{n-1}) + j \cdot (x_n \otimes x_{n-1}) + \\ &\quad (x_n \quad x_{n-1}) - j \cdot (x_n \otimes x_{n-1}) \\ &= 2 \cdot (x_n \quad x_{n-1}) \end{aligned} \quad (1.26)$$

The difference of products expressed in terms of the normalized complex primary signal, $x_n$, and the complex incident signal, $x_{n-1}$, is equivalent to the simplified complex cross product expression. This relationship can be seen in equation (1.27), which then substitutes equations (1.6), (1.4), and (1.5).

$$x_n^* \cdot x_{n-1} - x_n \cdot x_{n-1}^* = (x_n \quad x_{n-1}) + j \cdot (x_n \otimes x_{n-1}) - \quad (1.27)$$
$$(x_n^* \quad x_{n-1}^*) - j \cdot (x_n^* \otimes x_{n-1}^*)$$
$$= (x_n \quad x_{n-1}) + j \cdot (x_n \otimes x_{n-1}) -$$
$$(x_n \quad x_{n-1}) + j \cdot (x_n \otimes x_{n-1})$$
$$= j \cdot 2 \cdot (x_n \otimes x_{n-1})$$

Similar to the direct PD architecture performance surface, $\zeta_{\phi,n}$, the indirect PD architecture performance surface, $\zeta_{w,n}$, is equal to the product of the complex error signal, $e_n$, and the conjugate complex error, $e_n^*$. The indirect PD architecture performance surface, $\zeta_{w,n}$, forms a real convex function of the complex coefficient, with a global minimum at the optimum complex coefficient solution. This relationship can be seen in equation (1.28), which then substitutes equations (1.25), (1.26), (1.27) and (1.4).

$$\zeta_{w,n} = e_n \cdot e_n^* \quad (1.28)$$
$$= x_n \cdot x_n^* + x_{n-1} \cdot x_{n-1}^* \cdot w_n \cdot w_n \cdot w_n^* -$$
$$(x_n^* \cdot x_{n-1} \cdot w_n + x_n x_{n-1}^* \cdot w_n^*)$$
$$= |x_n|^2 + |x_{n-1}|^2 \cdot |w_n|^2 - (x_n^* \cdot x_{n-1} + x_n \cdot x_{n-1}^*) \cdot w_{RE,n} -$$
$$j \cdot (x_n^* \cdot x_{n-1} - x_n \cdot x_{n-1}^*) \cdot w_{IM,n}$$
$$= |x_n|^2 + |x_{n-1}|^2 \cdot |w_n|^2 - 2 \cdot$$
$$((x_n \quad x_{n-1}) - j \cdot (x_n \otimes x_{n-1})) w_n$$

The product of the complex error signal, $e_n$, and the conjugate complex incident signal, $x^*_{n-1}$, forms an expression that provides a convenient simplification of the subsequent definition of the gradient of the performance surface, as seen in equation (1.29), below, which substitutes equations (1.4) and (1.5).

$$e_n \cdot x_{n-1}^* = x_n \cdot x_{n-1}^* - x_{n-1} \cdot x_{n-1}^* \cdot w_n \quad (1.29)$$
$$= -|x_{n-1}|^2 \cdot w_n + (x_n^* \quad x_{n-1}^*) + j \cdot (x_n^* \otimes x_{n-1}^*)$$
$$= -|x_{n-1}|^2 \cdot w_n + (x_n \quad x_{n-1}) - j \cdot (x_n \otimes x_{n-1})$$

The gradient of the performance surface, $\tilde{\nabla}f_{w,n}$, is defined as the vector on the performance surface at coordinates corresponding to the complex coefficient, $w_n$, with an orientation corresponding to the direction of greatest increase, and a magnitude equal to the greatest rate of change, such being illustrated in equation (1.30), which substitutes equation (1.29).

$$\tilde{\nabla}\zeta_{w,n} = \frac{\partial}{\partial w}(\zeta_{w,n}) \quad (1.30)$$
$$= 2 \cdot (|x_{n-1}|^2 \cdot w_n - ((x_n \quad x_{n-1}) - j \cdot (x_n \otimes x_{n-1})))$$
$$= -2 \cdot e_n \cdot x_{n-1}^*$$

The indirect PD performance surface is a real function of the complex coefficient. Real and imaginary components of the complex coefficient represent two independent variables with orthogonal dimensions. The gradient of the performance surface is therefore expressed in terms of partial derivatives of the performance surface with respect to the real and imaginary components of the complex coefficient.

The complex coefficient, $w_n$, is iteratively adapted by applying a Least Mean Square (LMS) update rule, such that the unit advanced complex coefficient iteration, $w_{n+1}$, is equal to the present complex coefficient, $w_n$, minus an estimate of the gradient of the performance surface, $\tilde{\nabla}\zeta_{w,n}$, scaled by a constant rate of adaptation, $\mu$. This relationship can be seen in block 506 of FIG. 5 and in equation (1.31), below, which substitutes equation (1.30).

$$w_{n+1} w_n - \mu \cdot \tilde{\nabla}\zeta_{w,n} = w_n + 2 \cdot \mu e_n \cdot x_{n-1}^* \quad (1.31)$$

The gradient of the performance surface is estimated using instantaneous error from a single sample, and therefore has a unity memory depth. An advantage of this method of adaptation is its flexibility in accommodating quasi-stationary environments. The application of instantaneous error facilitates a higher frequency tracking rate, and operation in a dynamic environment, at the expense of misadjustment, or noise introduced by the adaptive process, primarily due to instantaneous gradient estimation error.

The selection of an appropriate rate of adaptation is often important, as the rate of adaptation is generally inversely proportional to the time constant of convergence and proportional to the misadjustment. To ensure stability, the rate of adaptation should be a positive scalar less than or equal to the inverse of the largest of the eigenvalues, $\lambda$, associated with the autocorrelation matrix, R, formed by sequential complex incident signal samples, which are incident on the complex coefficient. A smaller rate of adaptation may be appropriate in relatively stationary environments, or environments in which the frequency of the complex primary signal varies slowly relative to the convergence of the PD.

As the trace of the autocorrelation matrix is equal to the sum of the eigenvalues, the maximum rate of adaptation may be conservatively estimated as equal to the trace of the autocorrelation matrix. The complex incident signal is normalized, and the autocorrelation matrix has a diagonal with elements equal to one, resulting in a maximum rate of adaptation of approximately 0.5, as seen in equation (1.32).

$$\mu \leq \frac{1}{MAX(\lambda)} < \frac{1}{TR(R)} \approx 0.5 \quad (1.32)$$

In the context of the indirect PD architecture, exemplified in FIG. 5, the maximum rate of adaptation is independent of the magnitude of the complex primary signal.

Figure 6:
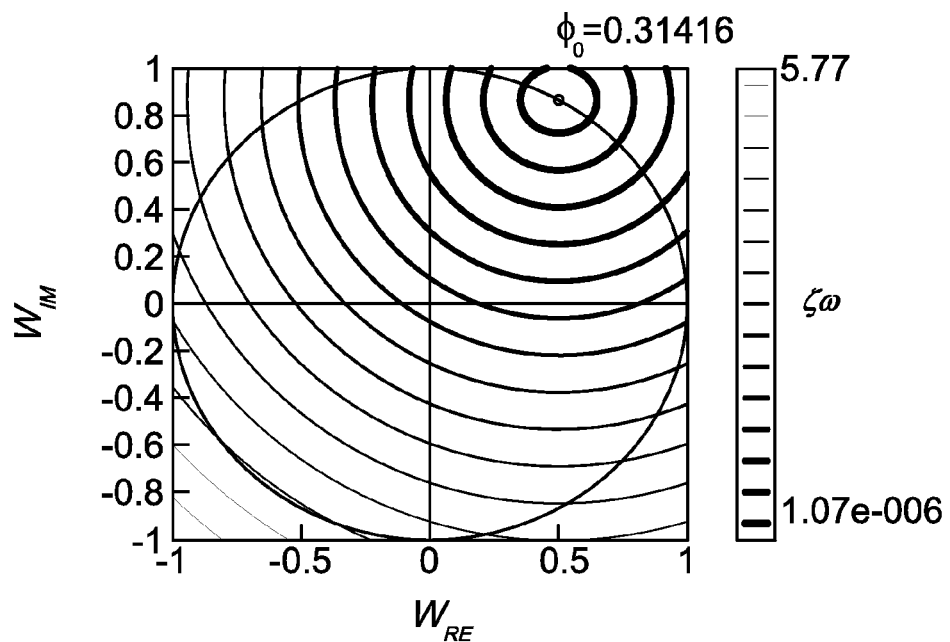
FIG. 6 is a graph showing an exemplary performance surface synthesized from an indirect PD architecture.

An exemplary performance surface synthesized from an indirect PD architecture is illustrated in FIG. 6. The performance surface has a complex difference error definition. The complex primary signal is constructed with a constant normalized frequency equal to $0.1 \cdot \pi$. The real and imaginary components of the complex coefficient are specified over a linearly sampled range in $[-1.0, 1.0]$. The darker regions of the performance surface depict solutions with smaller performance surface magnitude, whereas the lighter regions depict solutions with larger performance surface magnitude, with respect to the complex coefficient.

The performance surface is specific to the complex primary signal, and illustrates the presence of a global minimum, $\phi_o$, when the normalized phase of the complex coefficient is equal to the normalized frequency of the complex primary signal.

If the complex coefficient were allowed to adapt, the values selected by the adaptive process would be proximate to the unit circle, with unity magnitude and phase corresponding to the frequency of the complex primary signal, to minimize error in a least squares sense.

Figure 7:
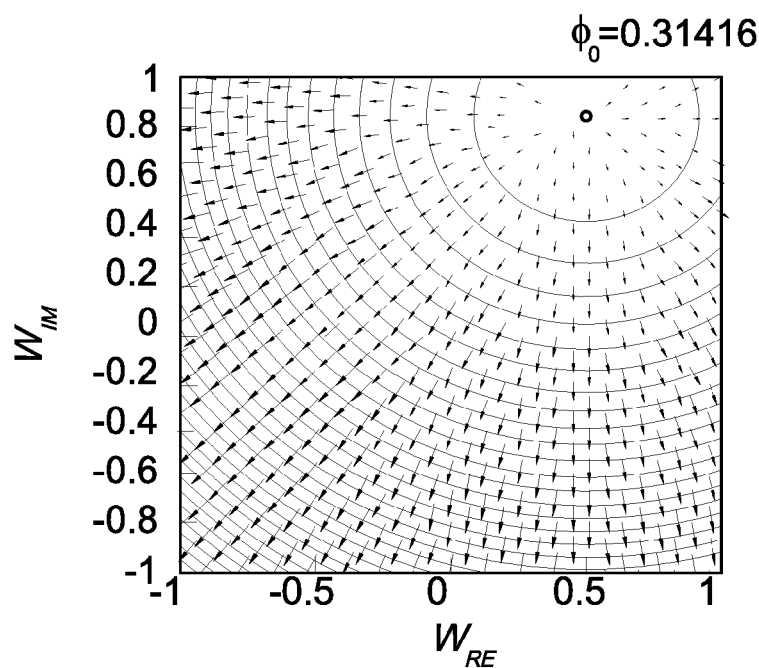
FIG. 7 is a graph showing the gradient of an exemplary specific performance surface providing an alternative view of gradient descent adaptation.

The gradient of the previously defined specific performance surface is shown in FIG. 7, which provides an alternative view of gradient descent adaptation. Concentric contiguous lines represent contours of equal magnitude on the performance surface. Radial vectors illustrate the direction and relative magnitude of the gradient at sampled complex coefficient values. Gradient vector magnitudes are scaled, such that shorter vectors represent smaller magnitudes, and longer vectors represent larger magnitudes.

Traversing the performance surface in the opposite direction of the gradient, from any initial complex coefficient state, results in convergence about the global minimum, $\phi_o$, when the normalized phase of the complex coefficient is equal to the normalized frequency of the complex primary signal.

LMS provides a convenient and efficient estimate of the gradient of the performance surface, supporting practical implementation of gradient descent to identify the optimum complex coefficient. Even in environments where the complex primary signal is stationary, the gradient estimate, which is constructed from a single instantaneous error estimate, causes the complex coefficient to continue to adapt and move in the neighborhood of the global minimum Movement based on gradient estimation error results in misadjustment.

Normalized Frequency Estimation

In contrast to the instantaneous normalized frequency, $f_{n-0.5}$, estimated by the direct PD architecture in FIG. 1, the instantaneous normalized frequency, $f_{n-0.5}$, of FIG. 5 is indirectly estimated from the normalized phase of the complex coefficient. The normalized phase difference over a one sample interval defines a first order discrete differentiator, which provides an approximation to the instantaneous normalized frequency of the complex primary signal. According to equation (1.33), below, and illustrated at block 508 of FIG. 5, the normalized frequency, $f_{n-0.5}$, is equal to the normalized phase of the complex coefficient, as the normalized phase of the complex coefficient approximates the phase difference necessary to reconcile successive samples of the complex primary signal over a one sample interval. A latency of 0.5 samples is inherent in a causal first order discrete differentiator.

$$f_{n-0.5} = \frac{d}{dn}(\phi_{n-0.5}) \approx \phi_{x,n} - \phi_{x,n-1} = \left(\frac{1}{\pi}\right) \cdot \mathrm{TAN}^{-1}(w_n) \quad (1.33)$$

Extraction of the instantaneous normalized frequency, $f_{n-0.5}$, requires a complex normalized phase operation. Efficient complex normalized phase approximation is often required to support implementation in computationally restrictive environments, including systems with real-time response constraints, and systems without efficient native or functional support for division or trigonometric operations.

A polynomial filter bank can be applied to accurately approximate the normalized phase of a complex input, by aliasing and subsequently reconstructing the phase of the complex input to restrict its range and reduce approximation error, eliminating the necessity to directly support division or trigonometric operations. Complex normalized phase approximation is defined below.

The indirect PD architecture illustrated in FIG. 5 can be repetitively applied to extract an instantaneous normalized frequency estimate of a synthetic FM complex primary signal constructed with a normalized carrier frequency, $f_c$, equal to zero, a normalized modulation frequency, $f_m$, equal to 0.01, and modulation index, $\beta$, specified over a linearly sampled range in [0.01, 1.0]. The rate of adaptation, $\mu$, is equal to 0.5. The complex primary signal is iteratively defined from a set of relatively narrow band complex FM signals at complex baseband.

Figure 8:
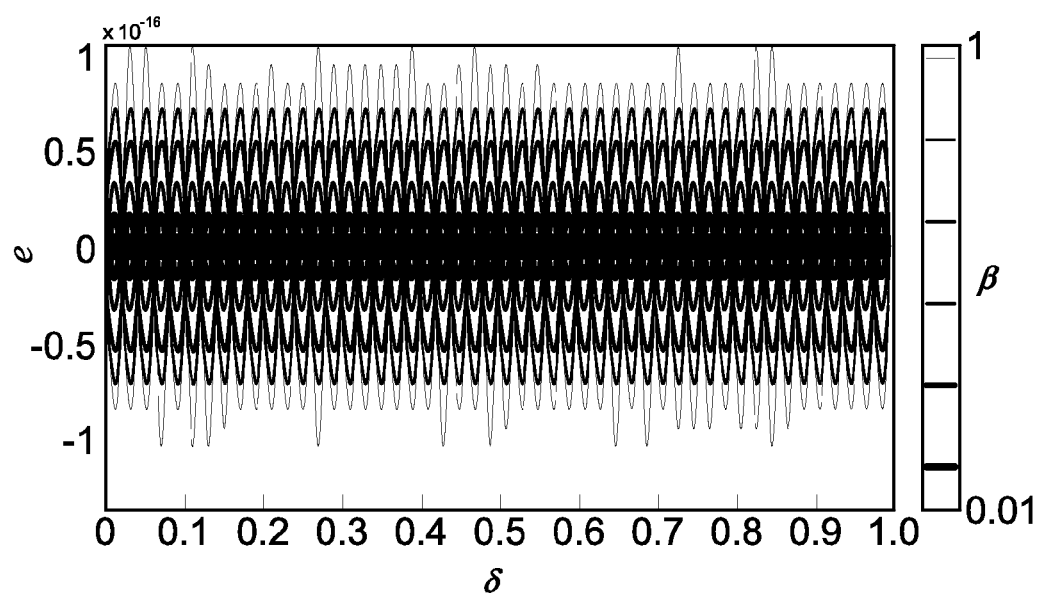
FIG. 8 is a graph showing an exemplary normalized frequency estimation error after latency compensation over a sample quantity.

The normalized frequency estimation error, or difference between the known instantaneous normalized frequency of the complex primary signal and the estimated normalized frequency, after latency compensation, is illustrated in FIG. 8 over a sample quantity equal to an arbitrary sampling rate, resulting in a period of observation of 1.0 second. Darker shaded traces correspond to signals with lower modulation index, and demonstrate lower normalized frequency estimation error. Contrastingly, lighter shaded traces correspond to signals with higher modulation index.

With the modulation index equal to 0.5, the $L_\infty$ norm of the normalized frequency estimation error is on the scale of $5.0 \cdot 10^{-17}$. At a sampling rate equal to 4.0 kHz, this condition equates to a maximum frequency estimation error of approximately $1.0 \cdot 10^{-13}$ Hz for this sequence. A more representative $L_1$ norm in a similar environment is on the scale of $1.0 \cdot 10^{-17}$, or $2.0 \cdot 10^{-14}$ Hz.

Figure 9:
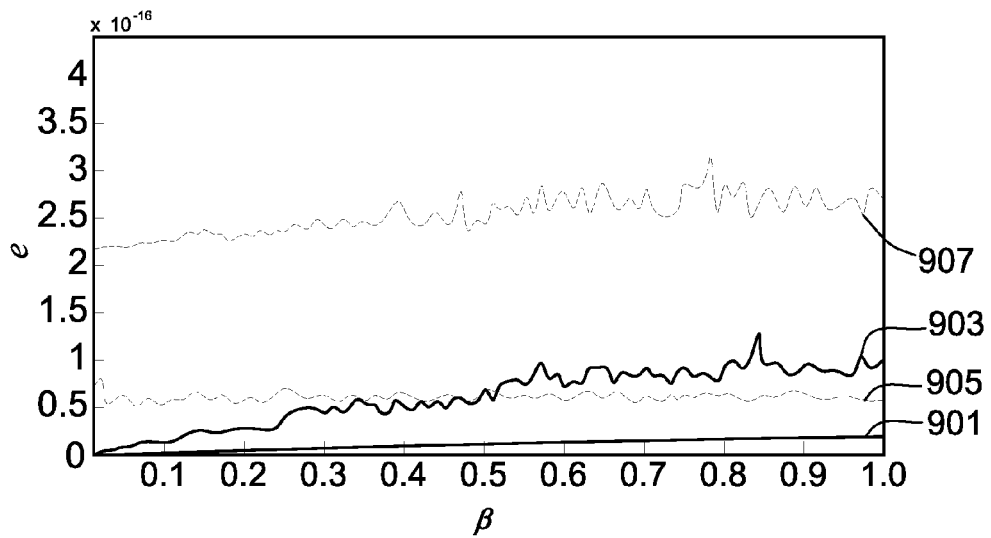
FIG. 9 is a graph showing an exemplary mean absolute error and an exemplary maximum absolute error of an exemplary normalized frequency estimation error illustrated over a set of complex FM signals specified over a linearly sampled range.

The $L_1$ and $L_\infty$ norm of the normalized frequency estimation error is illustrated over the set of complex FM signals previously defined, with modulation index, $\beta$, specified over a linearly sampled range in [0.01, 1.0], as shown in FIG. 9. The first trace 901 depicts the $L_1$ norm, and second trace 903 depicts the $L_\infty$ norm of the normalized frequency estimation error with respect to modulation index. The first and second broken traces 905 and 907 respectively illustrate the $L_1$ norm and $L_\infty$ norm resulting from an indirect PD implementation employing complex normalization approximation and complex normalized phase approximation, which eliminate the application of division, square root, and trigonometric operations employed in the otherwise identical ideal construction. Complex normalization approximation and complex normalized phase approximation is defined below.

The increase in normalized frequency estimation norm in the indirect PD implementation employing approximations may be attributed almost entirely to the complex normalized phase approximation, which is based on a polynomial filter bank synthesized with polynomials of order, M, equal to 4, and polynomial segment quantity, K, equal to 256.

Observed dependence of the indirect PD on modulation index is very low, indicating that the PD has a sufficiently high frequency tracking rate that the complex primary signals applied may be considered to vary slowly relative to adaptation and convergence.

Normalized frequency estimation is sufficiently accurate that the resulting errors are small enough be considered negligible, in many environments, relative to other existing sources of error, including numerical representation and finite word length effects. A signed error on the scale of $5.0 \cdot 10^{-17}$ represents over 55 bits of dynamic range.

Approximation and Synthesis

Efficient approximations to complex normalization and complex normalized phase operations are developed to support practical PD implementation in computationally restrictive environments, including systems with real-time response constraints, and systems without efficient native or functional support for division, square root, or trigonometric operations.

Development of the Complex Adaptive PD may require the construction of efficient alternatives to the divide operation implicit in complex normalization, or the arctangent operation implicit in complex normalized phase estimation in the indirect PD architecture. Efficient algorithms for complex normalization approximation, real inverse approximation, polynomial synthesis, and complex normalized phase approximation are defined below.

Complex normalization is utilized in the indirect and direct PD architectures. Complex normalized phase approximation is utilized in the indirect PD architecture, which is implicitly dependent upon real inverse approximation and polynomial synthesis as defined.

Complex Normalization Approximation

Complex normalization approximation is a function that operates on a complex input and produces an output equal to the complex input divided by the magnitude of the complex input. Complex normalization preserves phase and frequency content, and eliminates magnitude variation.

An iterative application of Newton's method for inverse square root approximation, applied to the squared magnitude of the complex input, eliminates the necessity to directly support division or square root operations.

The magnitude squared, v, of the complex input, x, is defined, in equation (2.1), below.

$$v = |x|^2 = x \cdot x^* \quad (2.1)$$

In equation (2.2), which substitutes equation (2.1), an iterative Newton's method inverse square root approximation is applied to the complex input magnitude squared, v, and multiplied by the complex input, x, to produce a complex output, y, with unity magnitude and phase corresponding to the complex input.

$$y \approx \frac{x}{|x|} = x \cdot (|x|^2)^{-0.5} = x \cdot v^{-0.5} \quad (2.2)$$

An indexed inverse square root approximation table, $u_k$, with index, k, is synthesized to provide a low resolution initial approximation to the inverse square root of an arbitrary real input, as seen in equation (2.3). The table provides initial values for subsequent application of Newton's method, which reduces the iteration quantity required to achieve a specified accuracy, and increases the probability of convergence.

$$u_k = \left(\frac{k \cdot R^2}{K}\right)^{-0.5} \quad (2.3)$$

$$k: [0, K-1]$$

The table accommodates positive arguments corresponding to the magnitude squared of complex inputs, in the range $[0, R^2]$. Therefore, the magnitude of supported complex inputs is in the range $[0, R]$, with a resolution determined by the table length, K.

Selection of the complex input magnitude range is typically based on a priori knowledge, and table length is selected considering the available memory and computational resources. A larger table typically requires more memory, and generally less iterations, and computational expense, to achieve the required approximation accuracy.

The inverse square root approximation table is defined as a linear indexed array with index, k, equal to the table location, which most closely corresponds to a specific complex input magnitude squared. The complex input magnitude squared is scaled by the table gain, or the inverse of the table resolution, and rounded to the nearest integer in the range of table indices, in equation (2.4).

$$k = \text{MIN}\left(\left\lfloor v \cdot \left(\frac{K}{R^2}\right) + 0.5 \right\rfloor, K-1\right) \quad (2.4)$$

The initial inverse square root approximation, $q_0$, is equal to the inverse square root approximation table value at the index extracted from a specific complex input magnitude squared, v, in equation (2.5).

$$q_0 = u_k \approx v^{-0.5} \quad (2.5)$$

The inverse square root approximation, $q_m$, is the iterative approximation with index, m, of Newton's method iteration quantity, M. The iterative inverse square root approximation is a recursive function of the previous inverse square root approximation iteration, $q_{m-1}$, and the complex input magnitude squared, in equation (2.6).

$$q_m = 0.5 \cdot q_{m-1} \cdot (3.0 - v \cdot q_{m-1}^2) \, m:[1, M] \quad (2.6)$$

Newton's method is not guaranteed to converge, though a good initial guess, provided by a sufficiently high resolution approximation table, virtually ensures convergence for values in the supported range. The quantity of iterations required is dependent upon the necessary accuracy of the approximation. Analysis to determine the quantity of iterations required should consider issues including error tolerance of dependent consumers of the approximations, and numerical representations or finite word-length effects.

An alternative implementation may specify a maximum Newton's method iteration quantity, and define a stopping case to terminate iteration when the change in successive approximations is too small to justify additional operations, though the expense of additional comparisons and conditional branches must be considered.

According to equation (2.7), below, the complex normalization approximation, y, is equal to the product of the complex input and the final Newton's method inverse square root approximation, $q_M$.

$$y = x \cdot q_M \approx \frac{x}{|x|} \quad (2.7)$$

Pathological cases for the complex normalization approximation include complex inputs whose magnitude squared is sufficiently proximate to zero. A small threshold, perhaps equal to the resolution of the inverse square root approximation table, can be used to test the complex input magnitude squared, and assign a default complex output, perhaps unity, when such conditions are observed.

A result indicating negative inverse square root approximation iteration may be identified as a failure to converge, perhaps due to a complex input whose magnitude significantly exceeds the supported range.

Real Inverse Approximation

Real inverse approximation is a function that operates on a real input and produces an output equal to the inverse of the input. An iterative application of Newton's method for inverse approximation, applied to the magnitude of the input, eliminates the necessity to directly support division. The input magnitude, v, is defined, in equation (2.8) as:

$$v = |x| \quad (2.8)$$

An iterative Newton's method inverse approximation is applied in equation (2.9) to the input magnitude, v, and multiplied by the sign of the input, x, to produce a real output, y, then substituting equation (2.8).

$$y \approx x^{-1} = \text{SIGN}(x) \cdot |x|^{-1} = \text{SIGN}(x) \cdot v^{-1} \quad (2.9)$$

An indexed inverse approximation table, $u_k$, with index k, is synthesized to provide a low resolution initial approximation to the inverse magnitude of an arbitrary real input, in equation (2.10), below. The table provides initial values for subsequent application of Newton's method, which reduces the iteration quantity required to achieve a specified accuracy, and increases the probability of convergence.

$$u_k = \left(\frac{k \cdot R}{K}\right)^{-1} \quad (2.10)$$

$$k: [0, K-1]$$

The table accommodates positive arguments corresponding to the magnitude of real inputs, in the range [0, R], with a resolution determined by the table length, K.

Selection of the input magnitude range is based on a priori knowledge, and table length is selected considering the available memory and computational resources. A larger table requires more memory, and generally less iterations, and computational expense, to achieve the required approximation accuracy.

The inverse approximation table is defined as a linear indexed array with index, k, equal to the table location which most closely corresponds to a specific input magnitude. The input magnitude is scaled by the table gain, or the inverse of the table resolution, and rounded to the nearest integer in the range of table indices, in (2.11).

$$k = \text{MIN}\left(\left\lfloor v \cdot \left(\frac{K}{R}\right) + 0.5\right\rfloor, K-1\right) \quad (2.11)$$

The initial inverse approximation, $q_0$, is equal to the inverse approximation table value at the index extracted from a specific input magnitude, v, in (2.12).

$$q_0 = u_k \approx v^{-1} \quad (2.12)$$

The inverse approximation, $q_m$, is the iterative approximation with index, m, of Newton's method iteration quantity, M. The iterative inverse approximation is a recursive function of the previous inverse approximation iteration, $q_{m-1}$, and the input magnitude, in (2.13).

$$q_m = q_{m-1} \cdot (2.0 - v \cdot q_{m-1}) \, m:[1,M] \quad (2.13)$$

Newton's method is not guaranteed to converge, though a good initial guess, provided by a sufficiently high resolution approximation table, virtually ensures convergence for values in the supported range. The quantity of iterations required is dependent, for example, upon the necessary accuracy of the approximation. Analysis to determine the quantity of iterations required should consider issues including error tolerance of dependent consumers of the approximations, and numerical representations or finite word-length effects.

An alternative implementation may specify a maximum Newton's method iteration quantity, and define a stopping case to terminate iteration when the change in successive approximations is too small to justify additional operations, though the expense of additional comparisons and conditional branches must be considered.

The real inverse approximation, y, as seen in equation (2.14), is equal to the product of the sign of the input and the final Newton's method inverse approximation, $q_M$.

$$y = \text{SIGN}(x) \cdot q_M \approx x^{-1} \quad (2.14)$$

Pathological cases for the real input approximation include, for example, real inputs whose magnitude is sufficiently proximate to zero. A small threshold, perhaps equal to the resolution of the inverse approximation table, can be used to test the input magnitude, and assign a default output, perhaps infinity, properly signed, when such conditions are observed.

A result indicating negative absolute inverse approximation iteration may be identified as a failure to converge, perhaps due to an input whose magnitude significantly exceeds the supported range.

Polynomial Synthesis

Polynomial synthesis constructs a polynomial vector, p, of order M, to approximate a relationship between an input vector, x, and an output vector, y, as seen in equation (2.15), below.

$$y_n = f(x_n) \approx \sum_{m=0}^{M} p_m \cdot x_n^{(M-m)} \quad (2.15)$$

$$n: [0, N-1] \quad N > M \quad M > 0$$

Input and output sequences of length N, with discrete time or position index n, express either a known functional correspondence, or an undefined relationship strictly expressed in the sequences. If a specific function to be approximated is known a priori, output sequences can be synthesized over an input sequence selected with an appropriate range and resolution. In lieu of synthetic sequences, acquired input and output sequences may be employed to extract a polynomial vector solution. The polynomial vector is expressed in standard form, as an indexed sequence of coefficients which operate on decreasing powers of the input. Input and output vectors are of dimension [1·N]. The polynomial vector is of dimension [1·(M+1)].

Selection of an appropriate polynomial order is based on many factors, which may include some combination of minimization of the approximation error, limitation of computational complexity, and knowledge of the nature of the input and output sequence relationship.

A Vandermonde matrix, V, is constructed such that matrix elements, $V_{n,m}$, are expressed as decreasing position-dependent powers of input vector elements, $x_n$, with discrete time or position row index n, and polynomial coefficient column index m, for a polynomial of order M. This relationship is shown in equation (2.16), below. The Vandermonde matrix is of dimension [N·(M+1)].

$$v_{n,m} = x_n^{(M-m)} \, n:[0,N-1] \, m:[0,M] \quad (2.16)$$

As a matter of convenience, the Vandermonde matrix can be expressed with columns of decreasing powers of the input vector, as the polynomial vector is expressed in standard form, as an indexed sequence of coefficients that operate on decreasing powers of the input.

The linear system of equations is defined such that the transposed output vector, $y^T$, is equal to the product of the Vandermonde matrix and the transposed polynomial vector, $p^T$, which is shown in equation (2.17).

$$V \cdot p^T = y^T \quad (2.17)$$

It may be desirable to manipulate a defined linear expression to extract a polynomial vector which minimizes the approximation error in a least squares sense. QR decomposition is a method of decomposing a matrix into orthogonal and upper triangular matrix factors. The product of an orthogonal matrix and its transpose is the identity matrix. All elements below the diagonal in an upper triangular matrix are zero. QR decomposition is useful in solving systems of linear equations, such as the polynomial approximation least squares problem.

Myriad competitive means of implementation of QR decomposition demonstrate relative differences in simplicity, numerical stability, computational complexity, and accuracy. Further development of QR decomposition is beyond the scope of this discussion, and therefore will not be discussed. QR decomposition is available in commercial software packages, including Matlab®.

The Vandermonde matrix is factored using QR decomposition into an orthogonal matrix, Q, and an upper triangular matrix, R, as shown in (2.18). The orthogonal matrix is of dimension [N·N]. The upper triangular matrix is of dimension [N·(M+1)].

$$Q \cdot R = V \quad (2.18)$$

Equation (2.19), which substitutes equation (2.18), shows that a derived relationship can be defined by substituting the orthogonal matrix and the upper triangular matrix for the Vandermonde matrix in the linear system of equations, and multiplying each side by the transpose of the orthogonal matrix.

$$Q \cdot Q^T \cdot R \cdot p^T = R \cdot p^T = Q^T \cdot y^T \quad (2.19)$$

The transposed polynomial vector, $p^T$, is equal to the product of the inverse upper triangular matrix, $R^{-1}$, the transposed orthogonal matrix, $Q^T$, and the transposed output vector, $y^T$, as seen in equation (2.20).

$$p^T = R^{-1} \cdot Q^T \cdot y^T \quad (2.20)$$

Numerical stability and accuracy may be significantly improved, especially in matrices that are poorly conditioned, by using alternative techniques to indirectly estimate the inverse of the upper triangular matrix.

Complex Normalized Phase Approximation

Figure 10:
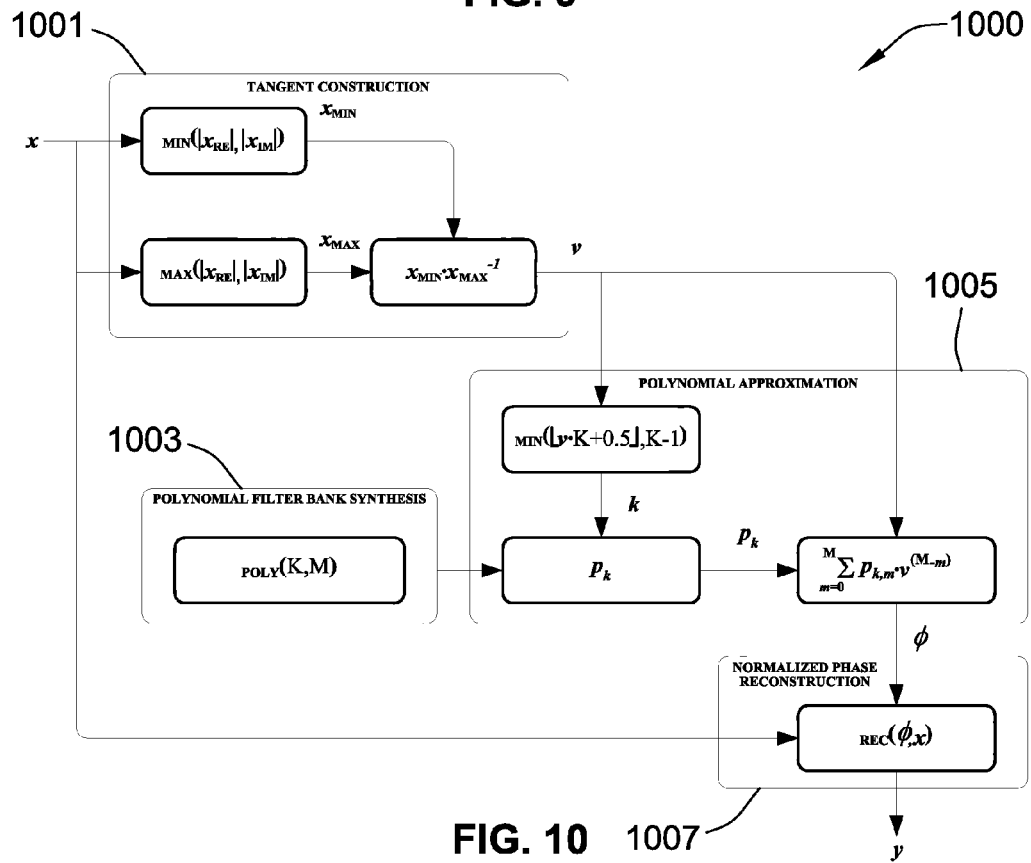
FIG. 10 is a schematic block diagram illustrating an exemplary method or algorithm for complex normalized phase approximation.

Complex normalized phase approximation is a function that operates on a complex input and produces an output equal to the normalized phase of the complex input. The supported range of the normalized phase is not restricted. FIG. 10 is a schematic block diagram illustrating an exemplary method 1000 for complex normalized phase approximation. FIG. 10 shows that complex normalized phase approximation can be performed in four primary steps: tangent construction 1001, polynomial filter bank synthesis 1003, polynomial approximation 1005, and normalized phase-reconstruction 1007.

Polynomial filter bank synthesis 1003 defines a table of indexed polynomial vectors, each designed to provide accurate normalized phase approximation over a specific and contiguous range of real tangent inputs. The polynomial filter bank supports a real tangent input range in [0, 1], corresponding to the normalized phase approximation range [0, 0.25]. This step is typically performed once during initialization, prior to exercising complex normalized phase approximation.

Tangent construction 1001 converts a complex input into a real tangent input in the restricted range supported by the polynomial filter bank 1003. Tangent construction 1001 defines the smallest absolute real tangent related to the complex input, complementing or reflecting the corresponding phase associated with the complex input as necessary to bound the supported real tangent range. As the tangent is nonlinear, and generally not well approximated by linear solutions, reducing the range of support of a polynomial vector may significantly increase its approximation accuracy. Polynomial order may be reduced corresponding to range reduction, while retaining sufficiently low approximation error, also reducing computational complexity and finite word length effects.

Polynomial approximation 1005 selects a specific polynomial vector from the polynomial filter bank 1003, corresponding to the real tangent input constructed from the complex input, and applies the polynomial to approximate the aliased normalized phase.

Normalized phase reconstruction 1007 converts the aliased normalized phase to the normalized phase corresponding to the complex input, by reflecting or complementing the aliased normalized phase, as necessary, based on the sign and relative magnitudes of the real and imaginary components of the complex input.

Complex normalized phase approximation may be applied to accurately approximate the normalized phase of a complex input, eliminating the necessity to directly support division or trigonometric operations.

A complex input, x, is converted to a real tangent input, and a specific polynomial vector, $p_k$, of order M, is applied to produce an aliased normalized phase approximation, and converted to normalized phase output, y, by phase reconstruction, as seen in equation (2.21).

$$y \approx \left(\frac{1}{\pi}\right) \cdot \text{TAN}^{-1}(x) = REC\left(\sum_{m=0}^{M} p_{k,m} \cdot \text{TAN}(x)^{(M-m)}\right) \quad (2.21)$$

$$k: [0, K-1]$$

Function notation indicating real tangent construction and normalized phase reconstruction is applied to simplify the primitive expression of the complex normalized phase solution.

Polynomial Filter Bank Synthesis

Polynomial filter bank synthesis, which is represented at box 1003 in FIG. 10, defines a table of indexed polynomial vectors, each designed to provide accurate normalized phase approximation over a specific and contiguous range of real tangent inputs. The polynomial filter bank supports a real tangent input range in [0, 1], corresponding to the normalized phase approximation range [0, 0.25].

Restricting the range of the polynomial filter bank bounds the real tangent input, which would otherwise be infinite, and allows each of the polynomial vectors stored in the polynomial filter bank to operate over a unique restricted range, reducing the effects of nonlinear behavior of the approximated arctangent function, and improving accuracy. Distributing the supported range over a finite quantity of polynomial vectors specifically designed to accommodate their associated ranges also reduces the polynomial order necessary to achieve a desired accuracy, reducing computational complexity, and finite word length effects in fixed point environments.

As polynomial filter bank synthesis is performed only once, prior to the application of complex normalized phase approximation, computational complexity is of significantly less concern than numerical stability and accuracy. The length of the polynomial filter bank is defined according to required accuracy, typically quantified in the form of a specified norm, and available storage. Polynomial synthesis is defined in section 2.3.

A real tangent vector, x, with length N, is defined over the range [0, 1], in equation (2.22). The tangent vector elements, $x_n$, are uniformly defined at a constant resolution, though alternative distributions may be specified, especially if it is important to achieve higher accuracy over a specific tangent range.

$$x_n = \frac{n}{N-1} \quad (2.22)$$
$$n: [0, N-1]$$

A normalized phase vector, y, with length N, is defined in equation (2.23) such that the normalized phase vector elements, $y_n$, are equal to the normalized arctangent of the corresponding real tangent vector elements.

$$y_n = \left(\frac{1}{\pi}\right) \cdot \text{TAN}^{-1}(x_n) \quad (2.23)$$
$$n: [0, N-1]$$

The real tangent vector and normalized phase vector are partitioned into K contiguous segments, with each segment resulting in the synthesis of an independent polynomial vector of the polynomial filter bank. Segments are uniformly defined with equal length, though the segments may be varied in length, to minimize approximation error at the segment boundaries, for example. Constant segment lengths generally result in the most efficient polynomial indexing.

A sample index vector, $n_k$, is defined for each of K contiguous segments of real tangent vector and normalized phase vector pairs in equation (2.24). Constant segment length is defined, resulting in segments of integer length equal to the ratio of the vector length, N, and the segment quantity, K.

$$n_k: \left[\left\lfloor k \cdot \left(\frac{N}{K}\right) + 0.5 \right\rfloor, \left\lfloor (k+1) \cdot \left(\frac{N}{K}\right) + 0.5 \right\rfloor - 1 \right] \quad (2.24)$$
$$k: [0, K-1]$$

A Vandermonde matrix, $V_k$, is constructed for each of K contiguous segments of real tangent vector segment, $x_{nk}$, defined over the range of sample index vector, $n_k$. Vandermonde matrix elements, $V_{k,n,m}$, are expressed as decreasing position-dependent powers of real tangent vector elements, with segment index k, time index n, and polynomial coefficient column index m, for a polynomial of order M, as seen in equation (2.25).

$$V_{k,n,m} = x_{n_k}^{(M-m)} k: [0, K-1] m: [0, M] \quad (2.25)$$

The Vandermonde matrix, $V_k$, for each segment k is factored using QR decomposition into an orthogonal matrix, $Q_k$, and an upper triangular matrix, $R_k$, as seen in equation (2.26).

$$Q_k \cdot R_k = V_k k: [0, K-1] \quad (2.26)$$

The transposed polynomial vector, $p_k^T$, for each segment k is equal to the product of the inverse upper triangular matrix, $R_k^{-1}$, the transposed orthogonal matrix, $Q_k^T$, and the transposed output vector, $y_k^T$, as seen in equation (2.27).

$$p_k^T = R_k^{-1} \cdot Q_k^T \cdot y_k^T k: [, K-1] \quad (2.27)$$

The polynomial filter bank is constructed as an array of the polynomial vectors corresponding to each defined contiguous segment of real tangent vector and normalized phase vector pairs. Specific polynomial vectors may be subsequently retrieved and applied through simple indexing that is entirely dependent on the value of a real tangent input.

Polynomial filter bank synthesis is performed once, at initialization, therefore the potentially significant associated computational complexity is not significant in the context of time critical implementation.

Tangent Construction

Tangent construction, which is represented at box 1001 in FIG. 10, converts a complex input into a real tangent input in the restricted range supported by the polynomial filter bank. Tangent construction defines the smallest absolute real tangent related to the complex input, complementing or reflecting the corresponding phase associated with the complex input as necessary to bound the supported real tangent range.

A complex input, x, is composed of orthogonal real and imaginary components, $x_{RE}$ and $x_{IM}$, respectively. The complex input is remapped or aliased to construct a real tangent restricted to the range [0, 1], such that the normalized phase of the complex input is recoverable.

A minimum complex input component magnitude, $x_{MIN}$, is the minimum of the real and imaginary component magnitudes of the complex input, as seen in equation (2.28).

$$x_{MIN} = \text{MIN}(|x_{RE}|, |x_{IM}|) \quad (2.28)$$

A maximum complex component magnitude, $x_{MAX}$, is the minimum of the real and imaginary component magnitudes of the complex input, as seen in equation (2.29).

$$x_{MAX} = \text{MAX}(|x_{RE}|, |x_{IM}|) \quad (2.29)$$

A real tangent input, v, is the ratio of the minimum and maximum complex component magnitudes, as seen in equation (2.30).

$$v = \text{TAN}(\pi \cdot \phi) = \frac{x_{MIN}}{x_{MAX}} = x_{MIN} \cdot x_{MAX}^{-1} \quad (2.30)$$

Division of the minimum complex component magnitude by the maximum complex component magnitude is implicit in tangent construction. Efficient real inverse approximation is required to support implementation in computationally restrictive environments, including systems with real-time response constraints, and systems without efficient native or functional support for division operations.

An iterative application of Newton's method for inverse approximation, applied to the maximum complex component magnitude, eliminates the necessity to directly support division operations. Real inverse approximation is discussed in further detail below.

Polynomial Approximation

Polynomial approximation, which is represented at box 1005 in FIG. 10, selects a specific polynomial vector from the polynomial filter bank, corresponding to the real tangent input constructed from the complex input, and applies the polynomial to approximate the aliased normalized phase.

A polynomial filter bank index, k, defines the integer index of the specific polynomial vector whose range of support most closely corresponds to the real tangent input, v, by rounding and range limiting the product of the real tangent input and the segment quantity K, as seen in equation (2.31).

$$k = \text{MIN}(\lfloor v \cdot K + 0.5 \rfloor, K-1) \quad (2.31)$$

An aliased normalized phase, $\phi$, is defined as the sum of products of coefficients of the polynomial, $p_k$, extracted from the polynomial filter bank at index k, and decreasing integer powers of the real tangent input, v, as seen in equation (2.32).

$$\phi \approx \left(\frac{1}{\pi}\right) \cdot \mathrm{TAN}^{-1}(v) = \sum_{m=0}^{M} p_{k,m} \cdot v^{(M-m)} \quad (2.32)$$

$$k: [0, K-1]$$

Normalized Phase Reconstruction

Normalized phase reconstruction, which is represented at box 1007 in FIG. 10, converts the aliased normalized phase to the normalized phase corresponding to the complex input, by reflecting or complementing the aliased normalized phase, as necessary, based on the signs and relative magnitudes of the real and imaginary components of the complex input.

The aliased normalized phase, φ, which can be defined in the range [0, 0.25], is restored to the actual normalized phase by reversing the process applied to constrain the range.

The aliased normalized phase, φ, can be reflected by multiplication by the sign of the product of the real and imaginary components of the complex input, x, as seen in equation (2.33).

$$\phi = \mathrm{SIGN}(x_{RE} \cdot x_{IM}) \cdot \phi \quad (2.33)$$

In equation (2.34), the aliased normalized phase, φ, is complemented by subtraction from 0.5, if and only if the minimum complex component magnitude is equal to the real complex component magnitude.

$$\phi = 0.5 - \phi_{IFF}(x_{MIN} == |x_{RE}|) \quad (2.34)$$

In equation (2.35), the aliased normalized phase, φ, is complemented by reduction by 1, if and only if the imaginary complex component is less than the negative real complex component, and the imaginary complex component is less than zero.

$$\phi = \phi - 1_{IFF}(x_{IM} < -x_{RE}) \mathrm{AND}(x_{IM} < 0) \quad (2.35)$$

In equation (2.36), the aliased normalized phase, φ, is complemented by addition by 1, if and only if the imaginary complex component is less than the negative real complex component, and the imaginary complex component is greater than or equal to zero.

$$\phi = \phi + 1_{IFF}(x_{IM} < -x_{RE}) \mathrm{AND}(x_{IM} \geq 0) \quad (2.36)$$

Conditional aliased normalized phase complements are mutually exclusive, and ensure that the resulting normalized phase remains in the range [−1, 1].

The normalized phase, y, is equal to the aliased normalized phase, subsequent to the application of defined reflection and conditional complement operations, as exemplified below in equation (2.37).

$$y = \phi \approx \left(\frac{1}{\pi}\right) \cdot \mathrm{TAN}^{-1}(x) \quad (2.37)$$

Complex normalized phase approximation is repetitively applied to extract the normalized phase of a synthetic complex primary signal constructed of a sequence with random non-zero magnitude, and normalized phase specified over a linearly sampled range in [−1, 1]. The complex normalized phase is approximated with a set of polynomial filter banks, with polynomial order, M, equal to 4, and polynomial segment quantity, K, defined over the range in [128, 256].

The polynomial order is constant across each instance of the polynomial filter bank, and only the polynomial segment quantity varies. Increasing the polynomial segment quantity causes a corresponding decrease in the region of support, in terms of the real tangent range, that each polynomial vector in the polynomial filter bank must accommodate. Increasing the density of polynomial vectors approximating the arctangent operation over decreasing ranges reduces the relative nonlinearity of the segments. Observed on a sufficiently small scale, even the most nonlinear of functions may be reasonably approximated by linear operations.

Figure 11:
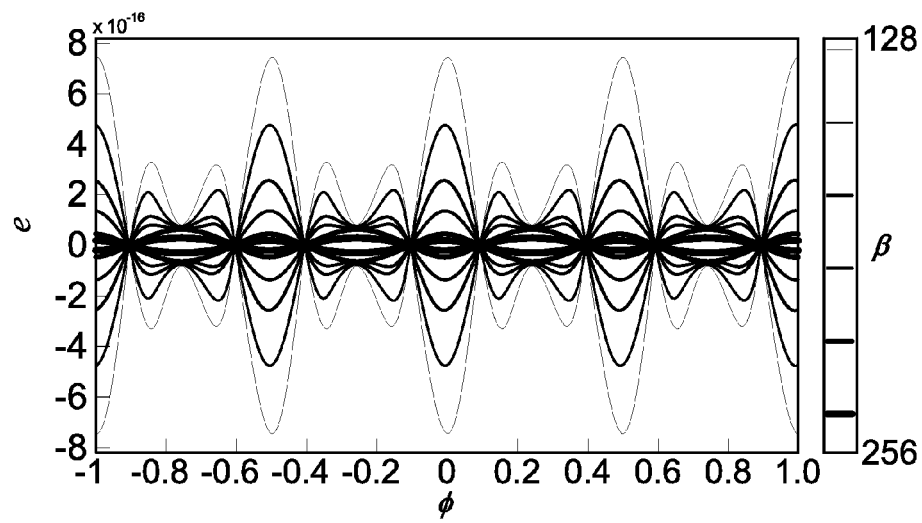
FIG. 11 is a graph showing an exemplary normalized phase estimation error illustrated over a contiguous range of normalized phase.

The normalized phase estimation error, or difference between the known instantaneous normalized phase of the complex primary signal and the estimated normalized phase, is illustrated in FIG. 11 over the contiguous range of normalized phase. Darker shaded traces in FIG. 11 correspond to polynomial filter banks with higher polynomial segment quantity, and demonstrate lower normalized phase estimation error. Lighter shaded traces, on the other hand, correspond to polynomial filter banks with lower polynomial segment quantity.

With polynomial segment quantity greater than approximately 200, the $L_\infty$ norm of the normalized phase estimation error is on the scale of $1.0 \cdot 10^{-16}$, which equates to a maximum normalized phase estimation error of approximately it $\pi \cdot 10^{-16}$ radians. The $L_1$ norm, which is representative of mean normalized phase estimation error, is at least one order of magnitude smaller across the complete phase range.

Figure 12:
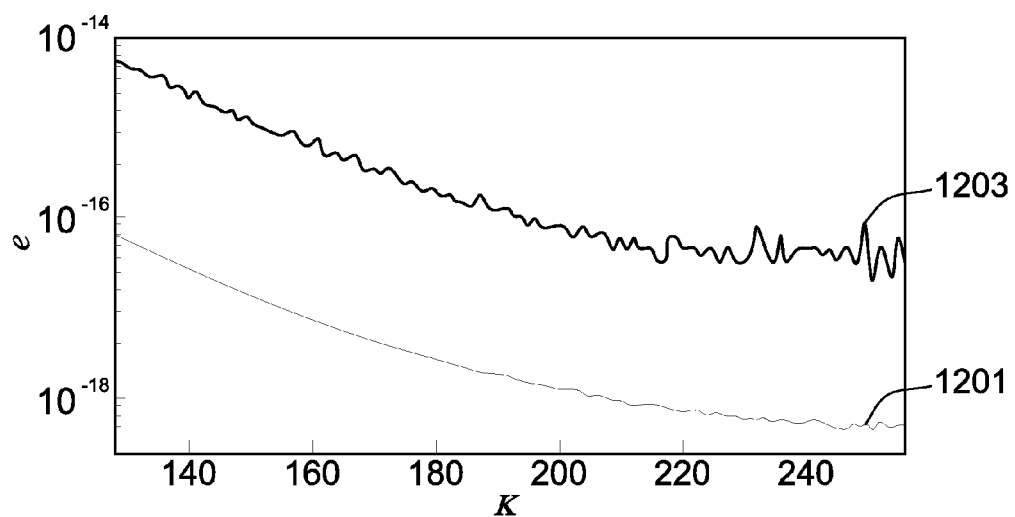
FIG. 12 is a graph showing an exemplary mean absolute error and an exemplary maximum absolute error of an exemplary complex normalized phase approximation error illustrated on a logarithmic scale over a set of polynomial filter banks.

FIG. 12 illustrates the $L_1$ and $L_\infty$ norm of the complex normalized phase approximation error on a logarithmic scale over the set of polynomial filter banks, with polynomial order, M, equal to 4, and polynomial segment quantity, K, defined over the range in [128, 256]. The first trace 1201 depicts the $L_1$ norm, and the second trace 1203 depicts the $L_\infty$ norm with respect to the polynomial segment quantity.

It is possible to select the dimensions of the polynomial filter bank to ensure that the $L_1$ or $L_\infty$ norm of the resulting normalized phase estimation error is within acceptable bounds for an application in a specific environment.

Polynomial order has a practical limit, based on the numerical representation employed, as high order polynomials implicitly increase estimation error due to the inability to accurately represent very large or very small intermediate terms arising from a power series in a numerical representation with a finite and constant dynamic range. High power terms in polynomial evaluation become practically unrealizable. We generally prefer to select the lowest order polynomial which supports acceptable accuracy, and no higher. Computational complexity is typically proportional to polynomial order.

Polynomial segment length can be increased to increase the accuracy of the normalized phase approximation. The practical limits on polynomial segment quantity are often derived from physical limitations on storage, and the observation that the $L_1$ or $L_\infty$ norm of the normalized phase estimation error decreases exponentially with respect to increasing polynomial segment quantity. For polynomial segment quantity greater than approximately 210, the reduction in estimation error is significantly diminished. Computational complexity of the solution is independent of polynomial segment quantity, as polynomial filter bank synthesis is performed only at initialization.

At the limit, the dynamic range of a numerical representation is insufficient to represent the accuracy promised by an incrementally larger polynomial segment length. A signed error on the scale of $1.0 \cdot 10^{-16}$, as observed at a polynomial segment quantity equal to 210, represents over 54 bits of dynamic range.

While particular embodiments and applications of the present disclosure have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims. To that extent, elements and limitations that are disclosed, for example, in the Abstract, Summary, and Detailed Description sections, but not explicitly set forth in the claims, should not be incorporated into the claims, singly or collectively, by implication, inference, or otherwise.

What is claimed is:

1. A method of estimating an instantaneous frequency of a complex primary signal, the method comprising:
   determining a normalized complex primary signal based, at least in part, on the complex primary signal;
   determining a normalized complex incident signal based, at least in part, on the normalized complex primary signal;
   determining a complex reference signal based, as at least in part, on the normalized complex incident signal;
   determining a complex error signal based, at least in part, on the normalized complex primary signal and the complex reference signal;
   minimizing an error of the complex error signal;
   iteratively adapting a complex coefficient or a normalized phase of a complex exponential, the iteratively adapting being based, at least in part, on the minimized error;
   estimating the instantaneous frequency of the complex primary signal, the estimating being directly from the normalized phase or indirectly by extracting a phase of the complex coefficient; and
   storing an indication of the estimated instantaneous frequency in at least one memory.

2. The method of claim 1, wherein the determining the normalized complex primary signal includes normalizing the complex primary signal to unity magnitude.

3. The method of claim 2, wherein the complex primary signal has a magnitude, and wherein normalizing the complex primary signal includes dividing the complex primary signal by a square root of the magnitude squared.

4. The method of claim 1, wherein the determining the normalized complex incident signal includes delaying the normalized complex primary signal by a predetermined unit.

5. The method of claim 1, wherein the complex error signal is a difference between the normalized complex primary signal and the complex reference signal.

6. The method of claim 1, wherein the complex reference signal is a product of the normalized complex incident signal and the complex exponential.

7. The method of claim 1, wherein the iteratively adapting the normalized phase includes applying a least mean square update rule such that a unit advanced normalized phase iteration is equal to a present normalized phase minus an estimate of a gradient of a performance surface scaled by a constant rate of adaptation.

8. The method of claim 7, wherein the performance surface is equal to a product of the complex error signal and a conjugate complex error.

9. The method of claim 8, wherein the performance surface forms a real convex function of the normalized phase, the real convex function having a global minimum at an optimum normalized phase solution.

10. The method of claim 1, wherein the error is a mean squared error, and wherein the minimizing the error occurs when the normalized phase approximates a normalized phase difference between the normalized complex primary signal and the complex incident signal.

11. The method of claim 1, wherein the normalized phase is equal to an absolute phase divided by $\pi$, and is defined over a range $[-1, 1]$ corresponding to the absolute phase range $[-\pi, \pi]$ radians.

12. The method of claim 1, wherein the complex reference signal is a product of the normalized complex incident signal and the complex coefficient.

13. The method of claim 1, wherein the iteratively adapting the complex coefficient includes applying a least mean square update rule such that a unit advanced complex coefficient iteration is equal to a present complex coefficient minus an estimate of a gradient of a performance surface scaled by a constant rate of adaptation.

14. The method of claim 13, wherein the performance surface is equal to a product of the complex error signal and the conjugate complex error.

15. The method of claim 14, wherein the performance surface forms a real convex function of the complex coefficient, the real convex function having a global minimum at the optimum complex coefficient solution.

16. The method of claim 13, wherein the constant rate of adaptation is a positive scalar less than or equal to an inverse of a largest eigenvalue, the eigenvalue being associated with an autocorrelation matrix formed by sequential complex incident signal samples associated with the complex coefficient.

17. The method of claim 1, wherein the error is a mean squared error, and wherein the minimizing the error occurs when the phase of the complex coefficient approximates a normalized phase difference between the normalized complex primary signal and the complex incident signal.

18. The method of claim 1, wherein the phase of the complex coefficient is estimated via a polynomial filter bank, the method further comprising:
   selecting a polynomial based, at least in part, on the complex coefficient;
   estimating an aliased phase of the complex coefficient from a polynomial expression; and
   reconstructing the phase of the complex coefficient to restrict a range and reduce an approximation error.

19. A method of estimating an instantaneous frequency of a complex primary signal associated with an induction motor using a complex adaptive phase discriminator, the method comprising:
   receiving the complex primary signal;
   normalizing the complex primary signal to generate a normalized complex primary signal;
   delaying the normalized complex primary signal by a predetermined unit to generate a normalized complex incident signal;
   calculating a complex reference signal, the complex reference signal being the product of the normalized complex incident signal and one of a complex exponential and a complex coefficient;
   calculating a complex error signal, the complex error signal being the difference between the normalized complex primary signal and the complex reference signal;
   minimizing an error of the complex error signal;
   iteratively adapting the complex coefficient or a normalized phase of the complex exponential, the iteratively adapting being based, at least in part, on an estimate of a gradient of a performance surface scaled by a constant rate of adaptation;

the iteratively adapting also being based, at least in part, on the minimized error;

estimating the instantaneous frequency of the complex primary signal, the estimating being directly from the normalized phase or indirectly by extracting a phase of the complex coefficient; and storing an indication of the estimated instantaneous frequency in at least one memory.

20. A computer-implemented method for utilizing a direct or indirect phase discriminator (PD) architecture to estimate an instantaneous frequency of a complex primary signal of a three-phase induction motor, the computer-implemented method comprising:

sampling the complex primary signal;

constructing a unity magnitude normalized complex primary signal from the complex primary signal;

generating a normalized complex incident signal by delaying the unity magnitude normalized complex primary signal by a predetermined unit;

calculating a complex reference signal as a product of the normalized complex incident signal and one of a complex exponential and a complex coefficient;

calculating a complex error signal as the difference between the normalized complex primary signal and the complex reference signal;

minimizing an error of the complex error signal;

iteratively adapting the complex coefficient or a normalized phase of the complex exponential, the iteratively adapting being based, at least in part, on an estimate of a gradient of a performance surface scaled by a constant rate of adaptation;

the iteratively adapting also being based, at least in part, on the minimized error;

calculating an estimate of the instantaneous frequency of the complex primary signal (a) directly from the normalized phase, or (b) indirectly by extracting a phase of the complex coefficient;

calculating an estimate of a fundamental frequency, a saliency frequency, or both, of the three-phase induction motor; and storing an indication of the estimate of the fundamental frequency, the saliency frequency, or both, in at least one memory.

* * * * *